US012761558B2

(12) United States Patent
Tomiga et al.

(10) Patent No.: US 12,761,558 B2
(45) Date of Patent: Oct. 13, 2026

(54) METHOD FOR PRODUCING ACTINIC RAY-SENSITIVE OR RADIATION-SENSITIVE RESIN COMPOSITION, PATTERN FORMING METHOD, AND METHOD FOR MANUFACTURING ELECTRONIC DEVICE

(71) Applicant: FUJIFILM Corporation, Tokyo (JP)

(72) Inventors: Takamitsu Tomiga, Haibara-gun (JP); Takumi Tanaka, Haibara-gun (JP); Fumihiro Yoshino, Haibara-gun (JP); Yuma Kurumisawa, Haibara-gun (JP)

(73) Assignee: FUJIFILM Corporation, Tokyo (JP)

(*) Notice: Subject to any disclaimer, the term of this patent is extended or adjusted under 35 U.S.C. 154(b) by 753 days.

(21) Appl. No.: 18/175,870

(22) Filed: Feb. 28, 2023

(65) Prior Publication Data

US 2023/0213861 A1 Jul. 6, 2023

Related U.S. Application Data

(63) Continuation of application No. PCT/JP2021/031615, filed on Aug. 27, 2021.

(30) Foreign Application Priority Data

Aug. 28, 2020 (JP) ................................ 2020-145081

(51) Int. Cl.
*G03F 7/039* (2006.01)
*G03F 7/038* (2006.01)

(52) U.S. Cl.
CPC .............. *G03F 7/039* (2013.01); *G03F 7/038* (2013.01)

(58) Field of Classification Search
CPC . G03F 7/039; G03F 7/038; G03F 7/16; G03F 7/0392

(Continued)

(56) References Cited

U.S. PATENT DOCUMENTS 4,745,422 A 5/1988 Matsuoka et al.
2010/0209852 A1 8/2010 Yeh et al.

(Continued)

FOREIGN PATENT DOCUMENTS

JP 62-117323 A 5/1987
JP 2013-151627 A 8/2013

(Continued)

OTHER PUBLICATIONS

International Search Report (PCT/ISA/210) and Written Opinion (PCT/ISA/237) dated Nov. 2, 2021 issued by the International Searching Authority in International Application No. PCT/JP2021/031615.

*Primary Examiner* — Caleen O Sullivan
(74) *Attorney, Agent, or Firm* — Sughrue Mion, PLLC

(57) ABSTRACT

A method for producing an actinic ray-sensitive or radiation-sensitive resin composition having a viscosity of 10 mPa·s or more, the method containing a step 1 of charging at least a resin of which polarity increases by an action of an acid, a photoacid generator, and a solvent as raw materials into a stirring tank, and a step 2 of stirring the raw materials in the stirring tank. A liquid temperature in the stirring tank is controlled to be equal to or lower than a 3.0° C. higher temperature than a liquid temperature at a start of the step 2 throughout the entire step 2, and the control of the liquid temperature in the stirring tank in the step 2 is performed by passing an inert gas through the stirring tank.

15 Claims, 1 Drawing Sheet

(58) Field of Classification Search
USPC ..................... 430/270.1, 271.1, 272.1, 273.1
See application file for complete search history.

(56) References Cited

U.S. PATENT DOCUMENTS

| | | | | |
|---|---|---|---|---|
| 2015/0024173 | A1 | 1/2015 | Tahara et al. | |
| 2018/0246406 | A1 | 8/2018 | Yoshino | |
| 2019/0185656 | A1 | 6/2019 | Ogawa et al. | |
| 2022/0081518 | A1* | 3/2022 | Tanaka ..................... | C08K 5/09 |

FOREIGN PATENT DOCUMENTS

| | | | |
|---|---|---|---|
| WO | 2013/118680 | A1 | 8/2013 |
| WO | 2017/078031 | A1 | 5/2017 |
| WO | 2018/037812 | A1 | 3/2018 |

* cited by examiner

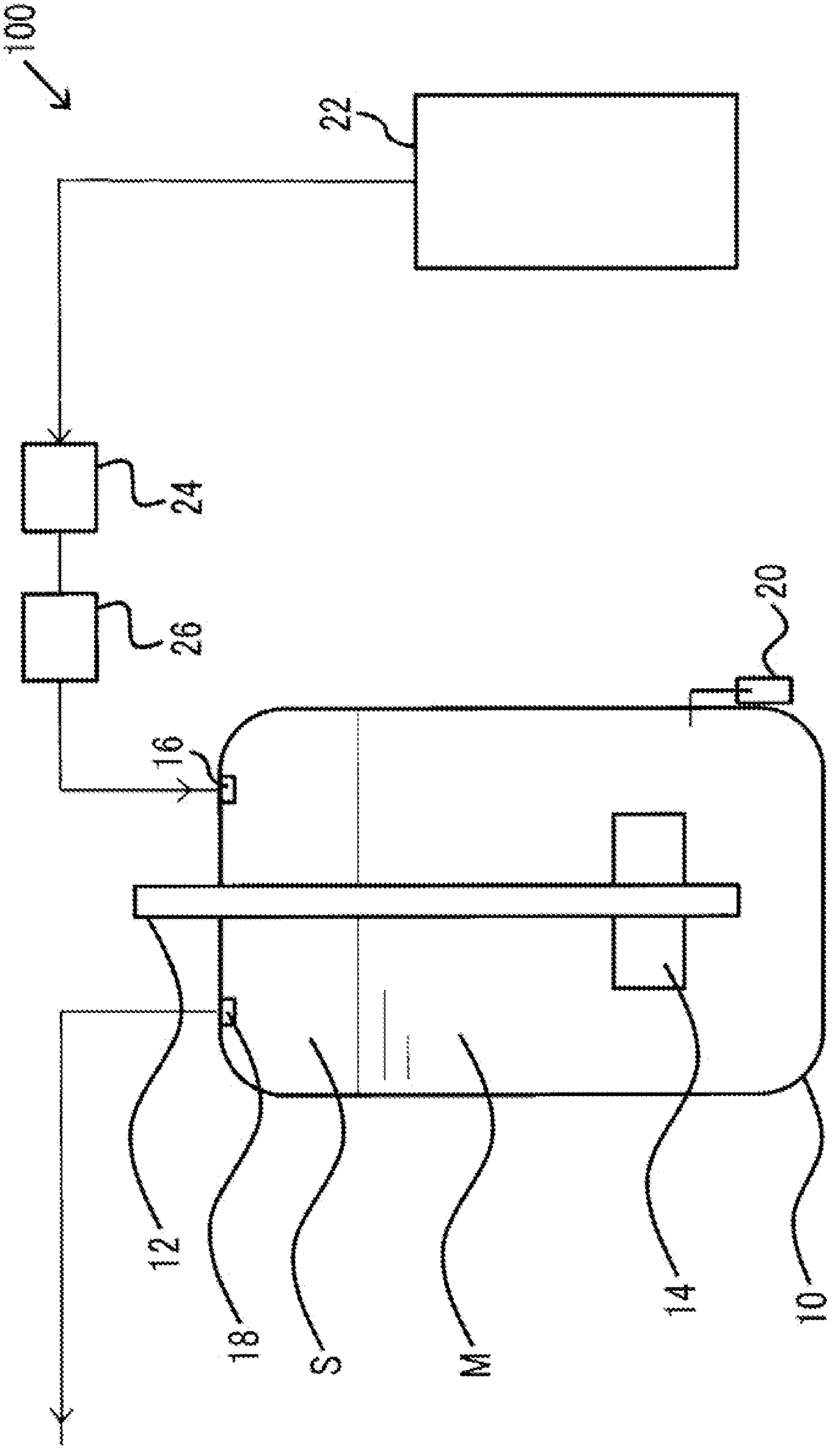
100
22
24
26
16
20
12
18
S
M
14
10

METHOD FOR PRODUCING ACTINIC RAY-SENSITIVE OR RADIATION-SENSITIVE RESIN COMPOSITION, PATTERN FORMING METHOD, AND METHOD FOR MANUFACTURING ELECTRONIC DEVICE

CROSS REFERENCE TO RELATED APPLICATION

This is a continuation of International Application No. PCT/JP2021/031615 filed on Aug. 27, 2021, and claims priority from Japanese Patent Application No. 2020-145081 filed on Aug. 28, 2020, the entire disclosures of which are incorporated herein by reference.

BACKGROUND OF THE INVENTION

1. Field of the Invention

The present invention relates to a method for producing an actinic ray-sensitive or radiation-sensitive resin composition, a pattern forming method, and a method for manufacturing an electronic device.

2. Description of the Related Art

In processes for manufacturing semiconductor devices such as an integrated circuit (IC) and a large scale integrated circuit (LSI), microfabrication by lithography using an actinic ray-sensitive or radiation-sensitive resin composition has been performed.

Examples of the lithography method include a method of forming a resist film by an actinic ray-sensitive or radiation-sensitive resin composition, and then exposing the obtained resist film, followed by performing development to form a resist pattern.

As the actinic ray-sensitive or radiation-sensitive resin composition, those containing a resin including a repeating unit having an acid-decomposable group (acid-decomposable resin) are known.

In recent years, an actinic ray-sensitive or radiation-sensitive resin composition suitable for forming a pattern using a thick-film resist film has also been proposed (see, for example, WO2017/078031A).

SUMMARY OF THE INVENTION

WO2017/078031A discloses an actinic ray-sensitive or radiation-sensitive resin composition which has a good sensitivity and is capable of forming a pattern having an excellent cross-sectional shape, but according to the studies conducted by the present inventors, it was found that there is room for further improvement in the uniformity of a film thickness in a wafer surface (hereinafter also referred to as the "in-plane uniformity of a film thickness") in an actinic ray-sensitive or radiation-sensitive resin film (in particular, an actinic ray-sensitive or radiation-sensitive resin film in the form of a thick film) obtained by the actinic ray-sensitive or radiation-sensitive resin composition.

It is an object of the present invention to provide a method for producing an actinic ray-sensitive or radiation-sensitive resin composition capable of forming an actinic ray-sensitive or radiation-sensitive resin film having extremely excellent in-plane uniformity of a film thickness in a case of forming an actinic ray-sensitive or radiation-sensitive resin film in the form of a thick film (for example, having a thickness of 1 μm or more), a pattern forming method using the method for producing an actinic ray-sensitive or radiation-sensitive resin composition, and a method for manufacturing an electronic device.

The present inventors have found that the objects can be accomplished by the following configurations.

[1] A method for producing an actinic ray-sensitive or radiation-sensitive resin composition having a viscosity of 10 mPa·s or more, the method comprising:

a step 1 of charging at least a resin of which polarity increases by an action of an acid, a photoacid generator, and a solvent as raw materials into a stirring tank; and a step 2 of stirring the raw materials in the stirring tank, in which a liquid temperature in the stirring tank is controlled to be equal to or lower than a 3.0° C. higher temperature than a liquid temperature at a start of the step 2 throughout the entire step 2, and the control of the liquid temperature in the stirring tank in the step 2 is performed by passing an inert gas through the stirring tank.

[2] The method for producing an actinic ray-sensitive or radiation-sensitive resin composition as described in [1], in which a temperature of the inert gas for passing through the stirring tank is 15° C. to 20° C.

[3] The method for producing an actinic ray-sensitive or radiation-sensitive resin composition as described in [1] or [2], in which the stirring in the step 2 is performed by a stirring shaft having a stirring blade, and a rotation speed of the stirring shaft is 50 to 400 rpm.

[4] The method for producing an actinic ray-sensitive or radiation-sensitive resin composition as described in any one of [1] to [3], in which the liquid temperature in the stirring tank is controlled to be equal to or lower than a 2.0° C. higher temperature than a liquid temperature at a start of the step 2 throughout the entire step 2.

[5] The method for producing an actinic ray-sensitive or radiation-sensitive resin composition as described in any one of [1] to [4], in which the viscosity of the actinic ray-sensitive or radiation-sensitive resin composition is 100 mPa·s or more.

[6] The method for producing an actinic ray-sensitive or radiation-sensitive resin composition as described in any one of [1] to [5], in which the stirring in the step 2 is performed by a stirring shaft having a stirring blade, and in a case where the viscosity of the actinic ray-sensitive or radiation-sensitive resin composition is denoted as X, $Y<40\times Ln(X)+65$ is satisfied (where Y represents a rotation speed of the stirring blade) in the step 2.

[7] The method for producing an actinic ray-sensitive or radiation-sensitive resin composition as described in any one of [1] to [6], in which the liquid temperature is controlled by adjusting a flow rate of the inert gas passing through the stirring tank.

[8] The method for producing an actinic ray-sensitive or radiation-sensitive resin composition as described in any one of [1] to [7], in which a concentration of solid contents of the actinic ray-sensitive or radiation-sensitive resin composition is 20% by mass or more.

[9] The method for producing an actinic ray-sensitive or radiation-sensitive resin composition as described in any one of [1] to [8], in which the resin of which polarity increases by an action of an acid includes a repeating unit having an acid-decomposable group and a repeating unit represented by General Formula (1), and the resin of which polarity increases by an action of an acid has an aromatic ring group.

(1)

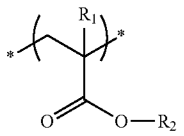

In General Formula (1), $R_1$ represents a hydrogen atom, a halogen atom, or an alkyl group.

$R_2$ represents an alkyl group having 2 or more carbon atoms.

A pattern forming method comprising:

a step of forming a resist film having a film thickness of 3 μm to 20 μm on a substrate using the actinic ray-sensitive or radiation-sensitive resin composition produced by the method as described in any one of [1] to [9];

a step of exposing the resist film; and a step of developing the exposed resist film using a developer to form a pattern.

A method for manufacturing an electronic device, comprising the pattern forming method as described in [10].

According to the present invention, it is possible to provide a method for producing an actinic ray-sensitive or radiation-sensitive resin composition capable of forming an actinic ray-sensitive or radiation-sensitive resin film having extremely excellent in-plane uniformity of a film thickness in a case of forming an actinic ray-sensitive or radiation-sensitive resin film in the form of a thick film (for example, having a thickness of 1 μm or more), a pattern forming method using the method for producing an actinic ray-sensitive or radiation-sensitive resin composition, and a method for manufacturing an electronic device.

BRIEF DESCRIPTION OF THE DRAWINGS

The FIGURE shows a schematic view of an example of a device which can be used in a method for producing an actinic ray-sensitive or radiation-sensitive resin composition according to an embodiment of the present invention.

DESCRIPTION OF THE PREFERRED EMBODIMENTS

Hereinafter, an example of a form for carrying out the present invention will be described.

In the present specification, a numerical value range expressed using "to" means a range that includes the preceding and succeeding numerical values of "to" as a lower limit value and an upper limit value, respectively.

In notations for a group (atomic group) in the present specification, in a case where the group is noted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group). In addition, an "organic group" in the present specification refers to a group including at least one carbon atom.

Furthermore, in the present specification, the types of substituents, the positions of substituents, and the number of substituents in a case where it is described that "a substituent may be contained" are not particularly limited. The number of the substituents may be, for example, one, two, three, or more. Examples of the substituent include a monovalent non-metal atomic group excluding a hydrogen atom, and the substituent can be selected from, for example, the following substituent T.

(Substituent T)

Examples of the substituent T include halogen atoms such as a fluorine atom, a chlorine atom, a bromine atom, and an iodine atom; alkoxy groups such as a methoxy group, an ethoxy group, and a tert-butoxy group; aryloxy groups such as a phenoxy group and a p-tolyloxy group; alkoxycarbonyl groups such as a methoxycarbonyl group, a butoxycarbonyl group, and a phenoxycarbonyl group; acyloxy groups such as an acetoxy group, a propionyloxy group, and a benzoyloxy group; acyl groups such as an acetyl group, a benzoyl group, an isobutyryl group, an acryloyl group, a methacryloyl group, and a methoxalyl group; alkylsulfanyl groups such as a methylsulfanyl group and a tert-butylsulfanyl group; arylsulfanyl groups such as a phenylsulfanyl group and a p-tolylsulfanyl group; alkyl groups; cycloalkyl groups; aryl groups; heteroaryl groups; a hydroxyl group; a carboxy group; a formyl group; a sulfo group; a cyano group; an alkylaminocarbonyl group; an arylaminocarbonyl group; a sulfonamide group; a silyl group; an amino group; a monoalkylamino group; a dialkylamino group; an arylamino group, a nitro group; a formyl group; and a combination thereof.

The bonding direction of divalent groups noted in the present specification is not limited unless otherwise specified. For example, in a compound represented by General Formula "L-M-N", M may be either *1-OCO—C(CN)—CH-*2 or *1-CH═C(CN)—COO-*2 assuming that in a case where M is —OCO—C(CN)—CH—, a position bonded to the L side is defined as *1 and a position bonded to the N side is defined as *2.

"(Meth)acryl" in the present specification is a generic term encompassing acryl and methacryl, and means "at least one of acryl or methacryl". Similarly, "(meth)acrylic acid" means "at least one of acrylic acid or methacrylic acid".

In the present specification, a weight-average molecular weight (Mw), a number-average molecular weight (Mn), and a dispersity (also described as a molecular weight distribution) (Mw/Mn) of a resin are defined as values expressed in terms of polystyrene by means of gel permeation chromatography (GPC) measurement (solvent: tetrahydrofuran, flow amount (amount of a sample injected): 10 μL, columns: TSK gel Multipore HXL-M manufactured by Tosoh Corporation, column temperature: 40° C., flow rate: 1.0 mL/min, and detector: differential refractive index detector) using a GPC apparatus (HLC-8120GPC manufactured by Tosoh Corporation).

"Actinic rays" or "radiation" in the present specification means, for example, a bright line spectrum of a mercury lamp, far ultraviolet rays typified by an excimer laser, extreme ultraviolet rays (EUV), X-rays, electron beams (EB), or the like. "Light" in the present specification means actinic rays or radiation.

Unless otherwise specified, "exposure" in the present specification encompasses not only exposure by a bright line spectrum of a mercury lamp, far ultraviolet rays typified by an excimer laser, extreme ultraviolet rays (EUV), X-rays, or the like, but also lithography by particle beams such as electron beams and ion beams.

[Method for Producing Actinic Ray-Sensitive or Radiation-Sensitive Resin Composition Having Viscosity of 10 mPa·s or More]

The method for producing an actinic ray-sensitive or radiation-sensitive resin composition having a viscosity of 10 mPa·s or more of an embodiment of the present invention is a method for producing an actinic ray-sensitive or radiation-sensitive resin composition having a viscosity of 10 mPa·s or more, the method including:

a step 1 of charging at least a resin of which polarity increases by an action of an acid, a photoacid generator, and a solvent as raw materials into a stirring tank; and a step 2 of stirring the raw materials in the stirring tank, in which a liquid temperature in the stirring tank is controlled to be equal to or lower than a 3.0° C. higher temperature than a liquid temperature at a start of the step 2 throughout the entire step 2, and the control of the liquid temperature in the stirring tank in the step 2 is performed by passing an inert gas through the stirring tank.

The present inventors have found that the in-plane uniformity of a film thickness of the actinic ray-sensitive or radiation-sensitive resin film is improved by the method for producing an actinic ray-sensitive or radiation-sensitive resin composition (hereinafter also referred to as "the composition of the present invention" or the "composition") (typically the resist composition) having a viscosity of 10 mPa·s or higher of the embodiment of the present invention (hereinafter also referred to as "the production method of the embodiment of the present invention"), in which a liquid temperature in the stirring tank is controlled to be equal to or lower than a 3.0° C. higher temperature than a liquid temperature at a start of the step 2 throughout the entire step 2, and the control of the liquid temperature in the stirring tank in the step 2 is performed by passing an inert gas through the stirring tank, as described in the step 2.

Mechanism by which the objects of the present invention can be accomplished by the production method of the embodiment of the present invention is not necessarily clear, but is considered to be as follows by the present inventors.

Generally, in the production of an actinic ray-sensitive or radiation-sensitive resin composition, various components and a solvent are mixed and stirred, but in a case of forming an actinic ray-sensitive or radiation-sensitive resin film in the form of a thick film (for example, having a thickness of 1 μm or more), a liquid substance of an actinic ray-sensitive or radiation-sensitive resin composition having a high viscosity (for example, 10 mPa·s or more) is suitably used. As a result of intensive studies conducted by the present inventors, it was found that in the production of such an actinic ray-sensitive or radiation-sensitive resin composition having a high viscosity, the temperature easily increases to a liquid temperature of the liquid substance due to a stirring heat accompanying the stirring operation, the solvent in the composition is volatilized with the increase in the liquid temperature. Further, the present inventors have presumed that the viscosity of the actinic ray-sensitive or radiation-sensitive resin composition finally prepared with the volatilization of such a solvent increases to a viscosity higher than the viscosity (target viscosity) as originally intended, which thus causes a decrease in the in-plane uniformity of a film thickness.

Based on this finding, the present inventors have adopted, in the step 2, a condition that "the liquid temperature in the stirring tank is controlled to be equal to or lower than a 3.0° C. higher temperature than a liquid temperature at a start of the step 2 throughout the entire step 2, and the control of the liquid temperature in the stirring tank in the step 2 is performed by passing an inert gas through the stirring tank", and thus, surprisingly, they have found that in the formation of an actinic ray-sensitive or radiation-sensitive resin film using an actinic ray-sensitive or radiation-sensitive resin composition with a high viscosity (for example, 10 mPa·s or more), the in-plane uniformity of a film thickness is extremely excellent. A reason thereof is considered to be as follows: the inert gas introduced into the stirring tank is discharged from the stirring tank while absorbing at least a part of the above-mentioned stirring heat during stirring, and thus, an excessive temperature increase in the liquid substance temperature is suppressed so that the solvent is less likely to volatilize, the viscosity of the finally prepared actinic ray-sensitive or radiation-sensitive resin composition is suppressed from increasing to more than a target viscosity, and further, the characteristics of the actinic ray-sensitive or radiation-sensitive resin composition are obtained as desired. Therefore, it is considered that the in-plane uniformity of a film thickness is improved.

An inert gas is used in the production method of the embodiment of the present invention. The inert gas is a low-reactivity gas used for chemical synthesis or storage of a highly reactive substance. Since the concentration of oxygen included in the gas is low, deterioration of the actinic ray-sensitive or radiation-sensitive resin composition due to the generation of radicals derived from oxygen can be suppressed, as compared with the atmosphere. From this viewpoint as well, it is considered that the in-plane uniformity of a film thickness is improved.

Hereinafter, a procedure of each step will be described in detail.

Furthermore, the production method of the embodiment of the present invention is preferably carried out in a clean room. The degree of cleanliness is preferably Class 6 or less, more preferably Class 5 or less, and still more preferably Class 4 or less in International Standard ISO 14644-1.

<Step 1>

The step 1 is a step of charging at least a resin of which polarity increases by the action of an acid, a photoacid generator, and a solvent as raw materials into a stirring tank.

Details of the resin of which polarity increases by the action of an acid, the photoacid generator, and the solvent used in the step 1 will be described later.

In addition, in the step 1, other components other than the resin of which polarity increases by the action of an acid, the photoacid generator, and the solvent may also be charged into the stirring tank. Examples of other components include an acid diffusion control agent, a hydrophobic resin, a surfactant, an alkali-soluble resin having a phenolic hydroxyl group, an onium carboxylate salt, and a dissolution inhibiting compound. Details of other components will also be described later.

The production method according to the embodiment of present invention can be performed using a production device for an actinic ray-sensitive or radiation-sensitive resin composition, and as the stirring tank in the step 1, a stirring tank in a production device for an actinic ray-sensitive or radiation-sensitive resin composition can be preferably used.

The production device which can be used in the present invention is not particularly limited, and a known production device can be used.

The FIGURE shows a schematic view of an example of a production device which can be used in the method for producing an actinic ray-sensitive or radiation-sensitive resin composition according to the embodiment of the present invention.

As shown in the FIGURE, a production device 100 includes a stirring tank 10 and a stirring shaft 12 rotatably mounted in the stirring tank 10.

It is preferable that a liquid contact part (a part in contact with the liquid) in the production device is lined or coated with a fluororesin and the like.

The stirring tank 10 is not particularly limited as long as it can contain a resin of which polarity increases by the action of an acid, a photoacid generator, a solvent, and the like, and examples thereof include known stirring tanks.

A shape of the bottom part of the stirring tank 10 is not particularly limited, examples thereof include a dish-like end plate shape, a semi-elliptical end plate shape, a flat end plate shape, and a conical end plate shape, and the dish-like end plate shape and the semi-elliptical end plate shape are preferable.

Baffle plates may be installed in the stirring tank 10 in order to improve the stirring efficiency.

The number of the baffle plates is not particularly limited, and is preferably 2 to 8.

A width of the baffle plate in the horizontal direction of the stirring tank 10 is not particularly limited, and is preferably ⅛ to ½ of the diameter of the stirring tank.

A length of the baffle plate in the height direction of the stirring tank is not particularly limited, but is preferably ½ or more, more preferably ⅔ or more, and still more preferably ¾ or more of the height from the bottom part of the stirring tank to the liquid level of the component to be charged.

The stirring shaft 12 has a stirring blade 14 for stirring a liquid accommodated in the stirring tank 10.

It is preferable that a drive source (for example, a motor) (not shown) is attached to the stirring shaft 12. In a case where the stirring shaft 12 is rotated by the drive source, the stirring blade 14 is rotated and the respective components charged into the stirring tank 10 are stirred.

The shape of the stirring blade 14 is not particularly limited, and examples thereof include a paddle blade, a propeller blade, and a turbine blade.

The stirring tank 10 is provided with a gas introduction port 16 for introducing an inert gas into the stirring tank 10, and a gas discharge port 18 for discharging the inert gas from the stirring tank 10, respectively.

In addition, the stirring tank 10 has a temperature sensor 20 for measuring a liquid temperature in the stirring tank. As shown in the FIGURE, the temperature sensor is suitably attached to a lower part of the stirring tank 10, and the liquid temperature in the stirring tank is measured by the temperature sensor.

The stirring tank 10 may have a material charging port for charging various materials into the stirring tank.

In addition, in the stirring tank 10, a cleaning nozzle (for example, a spray ball) may be disposed in an upper part of the tank.

In the step 1, in a case where the respective components are put into the stirring tank, the inside of the container may or may not be stirred. That is, with reference to the FIGURE, the stirring shaft 12 may or may not be rotated.

A method for stirring is not particularly limited, but it is preferable to use a stirring shaft provided with a stirring blade. A rotation speed of the stirring shaft having a stirring blade is not particularly limited, but is preferably 20 to 500 rotations per minute (rpm), more preferably 40 to 450 rpm, and still more preferably 50 to 400 rpm.

In the step 1, a method for putting the respective components as raw materials into the stirring tank is not particularly limited.

Examples thereof include a method of charging the respective components from a material charging port of the stirring tank. In a case of charging the respective components, the components may be charged sequentially or collectively. In addition, in a case of charging one component, the component may be charged a plurality of times.

In addition, in a case where the respective components are sequentially charged into the stirring tank, the charging order is not particularly limited.

For example, all of the raw materials (containing at least a resin of which polarity increases by the action of an acid, a photoacid generator, and a solvent) may be charged into the stirring tank at once, or may be dividedly charged into the stirring tank. In addition, for example, the solvent constituting the raw materials may be dividedly charged into the stirring tank a plurality of times.

Furthermore, a time at which the step 1 is completed (the end of the step 1) is a time at which the raw materials to be supplied to the stirring tank in the step 1 are completely put into the stirring tank.

Usually, in a case where the raw materials are charged into the stirring tank, it is preferable that the raw materials are charged such that a space is generated in the stirring tank. More specifically, as shown in the FIGURE, it is preferable that the respective components are charged into the stirring tank 10 such that a space S (void S) not occupied by a mixture M of the raw materials is generated in the stirring tank 10.

The occupancy rate of the raw materials in the stirring tank is not particularly limited, but is preferably 50% to 95% by volume, and more preferably 80% to 90% by volume.

Furthermore, the occupancy of the mixture can be determined by Expression (1).

$$\text{Occupancy} = \{(\text{Volume of mixture in stirring tank}/\text{Volume of container in stirring tank})\}\times 100 \qquad \text{Expression (1)}$$

In addition, a void ratio (proportion occupied by the space (void)) in the stirring tank is preferably 5% to 50% by volume, and more preferably 10% to 20% by volume.

The void ratio can be determined by Expression (2).

$$\text{Void ratio} = \{1-(\text{Volume of mixture in stirring tank}/\text{Volume of container in stirring tank})\}\times 100 \qquad \text{Expression (2)}$$

<Step 2>

The step 2 is a step of stirring the raw materials in the stirring tank, the liquid temperature in the stirring tank is controlled to be equal to or lower than a 3.0° C. higher temperature than a liquid temperature at a start of a step 2 throughout the entire step 2, and the control of the liquid temperature in the stirring tank in the step 2 is performed by passing the inert gas into the stirring tank.

A method for stirring is not particularly limited, but it is preferable to use a stirring shaft provided with a stirring blade. A rotation speed of the stirring shaft having a stirring blade (the same as the rotation speed of the stirring blade) is not particularly limited, but is preferably 20 to 500 rotations per minute (rpm), more preferably 40 to 450 rpm, and still more preferably 50 to 400 rpm.

In the step 2, the liquid temperature in the stirring tank is preferably controlled to be equal to or lower than a 3.0° C. higher temperature than the liquid temperature at the start of the step 2, and more preferably controlled to be equal to or lower than a 2.0° C. higher temperature than the liquid temperature at the start of the step 2, throughout the entire step 2.

In a case where the temperature reaches a high temperature which is 3.0° C. higher than the liquid temperature at the start of the step 2, volatilization of the liquid is unavoidable and a problem arises in the in-plane uniformity of the obtained film thickness.

Here, with reference to the FIGURE, the start time of the step 2 is the earliest time satisfying both of a state in which all the raw materials to be supplied are accommodated in the stirring tank 10 and a state in which the stirring shaft 12 is rotating. Therefore, at the start of the step 2, in the case where the stirring shaft 12 is rotating in the step 1, the time corresponds to a time point at which the supply of all the raw materials to be supplied into the stirring tank 10 is completed, and in a case where the stirring shaft 12 is not rotating in the step 1, the time corresponds to a time point at which the rotation of the stirring shaft 12 is started after the supply of all the raw materials to be supplied into the stirring tank 10 is completed.

In a case where the liquid temperature in the stirring tank satisfies the conditions, a lower limit value of the liquid temperature in the stirring tank is not particularly limited, but is preferably a 1.0° C. lower temperature than the liquid temperature at the start of the step 2, more preferably a 0.5° C. lower temperature than the liquid temperature at the start of the step 2, and still more preferably the liquid temperature at the start of the step 2.

In addition, the range of the liquid temperature in the stirring tank is preferably 20° C. to 28° C., more preferably 21° C. to 26° C., and still more preferably 22° C. to 24° C.

The liquid temperature in the stirring tank can be measured by the temperature sensor 20 as shown in the FIGURE.

As described above, in the step 2, the control of the liquid temperature in the stirring tank is performed by passing the inert gas into the stirring tank. Here, the passage of the inert gas is, in other words, a flow of the inert gas in the stirring tank, and with reference to the FIGURE, the inert gas is passed through the gas introduction port 16 of the stirring tank 10, the introduced inert gas is discharged from the gas discharge port 18 of the stirring tank 10, and the arrow in the FIGURE schematically shows the flow of the inert gas. Furthermore, in general, pipes are connected to the gas introduction port 16 and the gas discharge port 18 of the stirring tank 10, respectively, and the inert gas is introduced and discharged through such pipes. In addition, the gas introduction port 16, a flow rate control device 26 which will be described below, a gas temperature control device 24 which will described later, and a tank 22 which will described later are also each normally connected through the pipes to enable the flow of the inert gas.

In the present invention, a gas having an oxygen partial pressure of 15% or less with respect to the total pressure is defined as the inert gas.

Examples of components constituting the inert gas include nitrogen and a rare gas such as helium and argon, and nitrogen is preferable.

As the inert gas, a gas having a total partial pressure of the nitrogen and the rare gas of 90% or more of the total pressure is preferable, a gas having the total partial pressure of the nitrogen and the rare gas of 95% or more of the total pressure is more preferable, and a gas having a total partial pressure of the nitrogen and the rare gas of 99% or more of the total pressure is still more preferable.

In the production device 100 shown in the FIGURE, a tank 22 accommodating the inert gas is prepared, and the device is configured such that the inert gas discharged from the tank 22 can be introduced into the gas introduction port 16 of the stirring tank 10 through the gas temperature control device 24.

The gas temperature control device 24 is a device capable of adjusting a temperature of the introduced inert gas to a specific temperature for discharging.

The temperature of the inert gas for passing through the stirring tank is preferably 15° C. to 20° C., and more preferably 16° C. to 18° C.

Here, the temperature of the inert gas for passing through the stirring tank indicates a temperature of the inert gas to be introduced into the stirring tank, and in the production device 100 shown in the FIGURE, the temperature is adjusted to the preferred range by the gas temperature control device 24. The temperature of the inert gas for passing through the stirring tank is preferably equal to or lower than the liquid temperature at the start of the step 2.

In a preferred aspect, the stirring in the step 2 is performed by a stirring shaft having a stirring blade, and in a case where the viscosity of the actinic ray-sensitive or radiation-sensitive resin composition is denoted as X, it is preferable that $Y<40\times Ln(X)+65$ is satisfied (where Y represents a rotation speed of the stirring blade) in the step 2.

In addition, it is preferable to control the liquid temperature by adjusting the flow rate of the inert gas which is passed through the stirring tank. The flow rate of the inert gas is a flow rate of the inert gas introduced into the stirring tank.

The flow rate is not particularly limited, but is preferably 0 to 15 (L/min), more preferably 0 to 12 (L/min), and still more preferably 0 to 10 (L/min).

In a case where the liquid temperature is controlled by adjusting the flow rate of the inert gas which is passed through the stirring tank, the step 2 may include a period in which the inert gas is not flown (corresponding to a period in which the flow rate of the inert gas is zero) as far as the liquid temperature is controlled to be equal to or lower than a 3.0° C. higher temperature than the liquid temperature at the start of the step 2.

In the production device 100 shown in the FIGURE, the flow rate of the inert gas which is passed through the stirring tank can be measured by disposing the flow rate control device 26 capable of measuring and adjusting the flow rate of the inert gas between the gas temperature control device 24 and the gas introduction port 16 of the stirring tank 10. With such a configuration, the flow rate of the inert gas can be constantly monitored, particularly in the step 2.

Here, the liquid temperature in the stirring tank is controlled to be equal to or lower than a 3.0° C. higher temperature than a liquid temperature at the start of a step 2 throughout the entire step 2 and the control of the liquid temperature in the stirring tank in the step 2 is performed by passing the inert gas through the stirring tank, but a specific method therefor is not particularly limited.

For example, only by setting the liquid temperature at the start of the step 2 and setting the temperature and the flow rate of the inert gas for passing through the stirring tank, the liquid temperature may be controlled to be equal to or lower than a 3.0° C. higher temperature than a liquid temperature at a start of the step 2 throughout the entire step 2.

In addition, the liquid temperature may be controlled to be equal to or lower than a 3.0° C. higher temperature than the liquid temperature at the start of the step 2 by setting the liquid temperature at the start of the step 2 and setting the temperature and the flow rate of the inert gas for passing through the stirring tank by changing the flow rate of the inert gas at a time of reaching a temperature higher than the liquid temperature at the start of the step 2 by a predetermined temperature (for example, 2.5° C., 2.0° C., and 1.5° C.). The steps can also be repeated.

In any case, it is important to positively control the liquid temperature so as to be equal to or lower than a 3.0° C. higher temperature than a liquid temperature at a start of the step 2 throughout the entire step 2.

It is difficult to precisely control the liquid temperature by simply passing the inert gas into the stirring tank without detecting the liquid temperature in the stirring tank in the step 2.

The stirring time in the step 2 is not particularly limited, but is usually 7 to 24 hours, preferably 7 to 18 hours, and more preferably 8 to 12 hours.

The liquid temperature is actively controlled so as to be equal to or lower than a 3.0° C. higher temperature than a liquid temperature at a start of the step 2 throughout the entire step 2, but such the temperature control is performed, for example, by discharging the inert gas discharged from the tank 22 as shown in the FIGURE, while adjusting the temperature of the introduced inert gas to a specific temperature with the gas temperature control device 24, and charging the inert gas from the gas introduction port 16 into the stirring tank at a predetermined flow rate.

The measurement and the control of the flow rate of the inert gas are performed by the flow rate control device 26.

The viscosity of the actinic ray-sensitive or radiation-sensitive resin composition of the present invention is 10 mPa·s or more. The viscosity is a value measured by a viscometer (RE-85L) manufactured by TOKISANGYO Co., Ltd. at 25.0° C.

The viscosity of the composition of the present invention is preferably 50 mPa·s or more, more preferably 100 mPa·s or more, and still more preferably 200 mPa·s or more.

In addition, the upper limit value of the viscosity of the composition of the present invention is not particularly limited, but is usually 1000 mPa·s or less.

<Resin Having Polarity That Increases by Action of Acid>

The resin of which polarity increases by the action of an acid (hereinafter also simply described as a "resin (A)") preferably has a repeating unit (A-a) having an acid-decomposable group (hereinafter simply a "repeating unit (A-a)").

The acid-decomposable group refers to a group that decomposes by the action of an acid to generate a polar group. The acid-decomposable group preferably has a structure in which the polar group is protected by a leaving group that leaves by the action of an acid. That is, the resin (A) has a repeating unit (A-a) having a group that decomposes by the action of an acid to produce a polar group. A resin having this repeating unit (A-a) has an increased polarity by the action of an acid, and thus has an increased solubility in an alkali developer, and a decreased solubility in an organic solvent.

As the polar group, an alkali-soluble group is preferable, and examples thereof include an acidic group such as a carboxyl group, a phenolic hydroxyl group, a fluorinated alcohol group, a sulfonic acid group, a sulfonamide group, a sulfonylimide group, an (alkylsulfonyl) (alkylcarbonyl) methylene group, an (alkylsulfonyl) (alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group, and an alcoholic hydroxyl group.

Among those, as the polar group, the carboxyl group, the phenolic hydroxyl group, the fluorinated alcohol group (preferably a hexafluoroisopropanol group), or the sulfonic acid group is preferable.

Examples of the leaving group that leaves by the action of an acid include groups represented by Formulae (Y1) to (Y4).

$$-C(Rx_1)(Rx_2)(Rx_3) \qquad \text{Formula (Y1)}$$

$$-C(=O)OC(Rx_1)(Rx_2)(Rx_3) \qquad \text{Formula (Y2)}$$

$$-C(R_{36})(R_{37})(OR_{38}) \qquad \text{Formula (Y3)}$$

$$-C(Rn)(H)(Ar) \qquad \text{Formula (Y4)}$$

In Formula (Y1) and Formula (Y2), $Rx_1$ to $Rx_3$ each independently represent an (linear or branched) alkyl group or a (monocyclic or polycyclic) cycloalkyl group. Furthermore, in a case where all of $Rx_1$ to $Rx_3$ are each an (linear or branched) alkyl group, it is preferable that at least two of $Rx_1$, $Rx_2$, or $Rx_3$ are methyl groups.

Above all, it is preferable that $Rx_1$ to $Rx_3$ each independently represent a linear or branched alkyl group, and it is more preferable that $Rx_1$ to $Rx_3$ each independently represent the linear alkyl group.

Two of $Rx_1$ to $Rx_3$ may be bonded to each other to form a monocycle or a polycycle.

As the alkyl group of each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_3$, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group is preferable.

As the cycloalkyl group formed by the bonding of two of $Rx_1$ to $Rx_3$, a monocyclic cycloalkyl group such as a cyclopentyl group and a cyclohexyl group, and a polycyclic cycloalkyl group such as a norbornyl group, a tetracyclodecanyl group, a tetracyclododecanyl group, and an adamantyl group is preferable, and a monocyclic cycloalkyl group having 5 or 6 carbon atoms is more preferable.

In the cycloalkyl group formed by the bonding of two of $Rx_1$ to $Rx_3$, for example, one of the methylene groups constituting the ring may be substituted with a heteroatom such as an oxygen atom, or a group having a heteroatom, such as a carbonyl group.

With regard to the group represented by Formula (Y1) or Formula (Y2), for example, an aspect in which $Rx_1$ is a methyl group or an ethyl group, and $Rx_2$ and $Rx_3$ are bonded to each other to form a cycloalkyl group is preferable.

In Formula (Y3), $R_{36}$ to $R_{38}$ each independently represent a hydrogen atom or a monovalent substituent. $R_{37}$ and $R_{38}$ may be bonded to each other to form a ring. Examples of the monovalent substituent include an alkyl group, a cycloalkyl group, an aryl group, an aralkyl group, and an alkenyl group. It is also preferable that $R_{36}$ is the hydrogen atom.

As Formula (Y3), a group represented by Formula (Y3-1) is preferable.

(Y3-1)

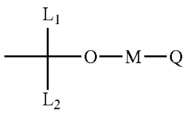

Here, $L_1$ and $L_2$ each independently represent a hydrogen atom, an alkyl group, a cycloalkyl group, an aryl group, or a group formed by combination thereof (for example, a group formed by combination of an alkyl group and an aryl group).

M represents a single bond or a divalent linking group.

Q represents an alkyl group which may have a heteroatom, a cycloalkyl group which may have a heteroatom, an aryl group which may have a heteroatom, an amino group, an ammonium group, a mercapto group, a cyano group, an aldehyde group, or a group formed by combination thereof (for example, a group formed by combination of an alkyl group and a cycloalkyl group).

In the alkyl group and the cycloalkyl group, for example, one of the methylene groups may be substituted with a heteroatom such as an oxygen atom or a group having a heteroatom, such as a carbonyl group.

Furthermore, it is preferable that one of $L_1$ or $L_2$ is a hydrogen atom, and the other is an alkyl group, a cycloalkyl group, an aryl group, or a group formed by combination of an alkylene group and an aryl group.

At least two of Q, M, or $L_1$ may be bonded to each other to form a ring (preferably a 5- or 6-membered ring).

From the viewpoint of pattern miniaturization, $L_2$ is preferably a secondary or tertiary alkyl group, and more preferably the tertiary alkyl group. Examples of the secondary alkyl group include an isopropyl group, a cyclohexyl group, and a norbornyl group, and examples of the tertiary alkyl group include a tert-butyl group and an adamantane ring group. In these aspects, since the glass transition temperature (Tg) and the activation energy are increased, it is possible to suppress fogging in addition to ensuring film hardness.

In Formula (Y4), Ar represents an aromatic ring group. Rn represents an alkyl group, a cycloalkyl group, or an aryl group. Rn and Ar may be bonded to each other to form a non-aromatic ring. Ar is more preferably the aryl group.

As the repeating unit (A-a), a repeating unit represented by Formula (A) is also preferable.

(A)

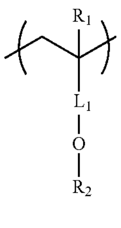

$L_1$ represents a divalent linking group which may have a fluorine atom or an iodine atom, $R_1$ represents a hydrogen atom, a fluorine atom, an iodine atom, a fluorine atom, an alkyl group which may have an iodine atom, or an aryl group which may have a fluorine atom or an iodine atom, and $R_2$ represents a leaving group that leaves by the action of an acid and may have a fluorine atom or an iodine atom. It should be noted that at least one of $L_1$, $R_1$, or $R_2$ has a fluorine atom or an iodine atom.

$L_1$ represents a divalent linking group which may have a fluorine atom or an iodine atom. Examples of the divalent linking group which may have a fluorine atom or an iodine atom include —CO—, —O—, —S—, —SO—, —$SO_2$—, a hydrocarbon group which may have a fluorine atom or an iodine atom (for example, an alkylene group, a cycloalkylene group, an alkenylene group, and an arylene group), and a linking group formed by the linking of a plurality of these groups. Among those, $L_1$ is preferably —CO—, or -arylene group -alkylene group having fluorine atom or iodine atom from the viewpoint that the effect of the present invention is more excellent.

As the arylene group, a phenylene group is preferable.

The alkylene group may be linear or branched. The number of carbon atoms of the alkylene group is not particularly limited, but is preferably 1 to 10, and more preferably 1 to 3.

The total number of fluorine atoms and iodine atoms included in the alkylene group having a fluorine atom or an iodine atom is not particularly limited, but is preferably 2 or more, more preferably 2 to 10, and still more preferably 3 to 6 from the viewpoint that the effect of the present invention is more excellent.

$R_1$ represents a hydrogen atom, a fluorine atom, an iodine atom, an alkyl group which may have a fluorine atom or an iodine atom, or an aryl group which may have a fluorine atom or an iodine atom.

The alkyl group may be linear or branched. The number of carbon atoms of the alkyl group is not particularly limited, but is preferably 1 to 10, and more preferably 1 to 3.

The total number of fluorine atoms and iodine atoms included in the alkyl group having a fluorine atom or an iodine atom is not particularly limited, but is preferably 1 or more, more preferably 1 to 5, and still more preferably 1 to 3 from the viewpoint that the effect of the present invention is more excellent.

The alkyl group may have a heteroatom such as an oxygen atom, other than a halogen atom.

$R_2$ represents a leaving group that leaves by the action of an acid and may have a fluorine atom or an iodine atom.

Examples of the leaving group include groups represented by Formulae (Z1) to (Z4).

Formula (Z1)

$$—C(Rx_{11})(Rx_{12})(Rx_{13})$$

Formula (Z2)

$$—C(=O)OC(Rx_{11})(Rx_{12})(Rx_{13})$$

Formula (Z3)

$$—C(R_{136})(R_{137})(OR_{138})$$

Formula (Z4)

$$—C(Rn_1)(H)(Ar)$$

In Formula (Z1) and Formula (Z2), $Rx_{11}$ to $Rx_{13}$ each independently represent an (linear or branched) alkyl group which may have a fluorine atom or an iodine atom, or a (monocyclic or polycyclic) cycloalkyl group which may have a fluorine atom or an iodine atom. Furthermore, in a case where all of $Rx_{11}$ to $Rx_{13}$ are each an (linear or branched) alkyl group, it is preferable that at least two of $Rx_{11}$, $Rx_{12}$, or $Rx_{13}$ are methyl groups.

$Rx_{11}$ to $Rx_{13}$ are the same as $Rx_1$ to $Rx_3$ in Formula (Y1) and Formula (Y2) described above, respectively, except that they may have a fluorine atom or an iodine atom, and have the same definitions and suitable ranges as those of the alkyl group and the cycloalkyl group.

In Formula (Z3), $R_{136}$ to $R_{138}$ each independently represent a hydrogen atom, or a monovalent substituent which may have a fluorine atom or an iodine atom. $R_{137}$ and $R_{138}$ may be bonded to each other to form a ring. Examples of the monovalent substituent which may have a fluorine atom or an iodine atom include an alkyl group which may have a fluorine atom or an iodine atom, a cycloalkyl group which may have a fluorine atom or an iodine atom, an aryl group which may have a fluorine atom or an iodine atom, an aralkyl group which may have a fluorine atom or an iodine atom, and a group formed by combination thereof (for example, a group formed by combination of the alkyl group and the cycloalkyl group).

Incidentally, the alkyl group, the cycloalkyl group, the aryl group, and the aralkyl group may include a heteroatom such as an oxygen atom, in addition to the fluorine atom and the iodine atom. That is, in the alkyl group, the cycloalkyl group, the aryl group, and the aralkyl group, for example, one of the methylene groups may be substituted with a heteroatom such as an oxygen atom or a group having a heteroatom, such as a carbonyl group.

As Formula (Z3), a group represented by Formula (Z3-1) is preferable.

(Z3-1)

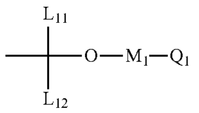

Here, $L_{11}$ and $L_{12}$ each independently represent a hydrogen atom; an alkyl group which may have a heteroatom selected from the group consisting of a fluorine atom, an iodine atom, and an oxygen atom; a cycloalkyl group which may have a heteroatom selected from the group consisting of a fluorine atom, an iodine atom, and an oxygen atom; an aryl group which may have a heteroatom selected from the group consisting of a fluorine atom, an iodine atom, and an oxygen atom; or a group formed by combination thereof (for example, a group formed by combination of an alkyl group and a cycloalkyl group, each of which may have a heteroatom selected from the group consisting of a fluorine atom, an iodine atom, and an oxygen atom).

$M_1$ represents a single bond or a divalent linking group.

$Q_1$ represents an alkyl group which may have a heteroatom selected from the group consisting of a fluorine atom, an iodine atom, and an oxygen atom; a cycloalkyl group which may have a heteroatom selected from the group consisting of a fluorine atom, an iodine atom, and an oxygen atom; an aryl group which may have a heteroatom selected from the group consisting of a fluorine atom, an iodine atom, and an oxygen atom; an amino group; an ammonium group; a mercapto group; a cyano group; an aldehyde group; a group formed by combination thereof (for example, a group formed by combination of the alkyl group and the cycloalkyl group, each of which may have a heteroatom selected from the group consisting of a fluorine atom, an iodine atom, and an oxygen atom).

In Formula (Z4), $Ar_1$ represents an aromatic ring group which may have a fluorine atom or an iodine atom. $Rn_1$ represents an alkyl group which may have a fluorine atom or an iodine atom, a cycloalkyl group which may have a fluorine atom or an iodine atom, or an aryl group which may have a fluorine atom or an iodine atom. $Rn_1$ and $Ar_1$ may be bonded to each other to form a non-aromatic ring.

As the repeating unit (A-a), a repeating unit represented by General Formula (AI) is also preferable.

(AI)

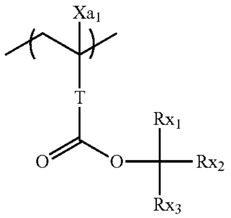

In General Formula (AI), $Xa_1$ represents a hydrogen atom, or an alkyl group which may have a substituent.

T represents a single bond or a divalent linking group.

$Rx_1$ to $Rx_3$ each independently represent an (linear or branched) alkyl group or a (monocyclic or polycyclic) cycloalkyl group. It should be noted that in a case where all of $Rx_1$ to $Rx_3$ are (linear or branched) alkyl groups, it is preferable that at least two of $Rx_1$, $Rx_2$, or $Rx_3$ are methyl groups.

Two of $Rx_1$ to $Rx_3$ may be bonded to each other to form a (monocyclic or polycyclic) cycloalkyl group.

Examples of the alkyl group which may have a substituent, represented by $Xa_1$, include a methyl group and a group represented by $-CH_2-R_{11}$. $R_{11}$ represents a halogen atom (a fluorine atom or the like), a hydroxyl group, or a monovalent substituent, examples thereof include an alkyl group having 5 or less carbon atoms, which may be substituted with a halogen atom, an acyl group having 5 or less carbon atoms, which may be substituted with a halogen atom, and an alkoxy group having 5 or less carbon atoms, which may be substituted with a halogen atom; and an alkyl group having 3 or less carbon atoms is preferable, and a methyl group is more preferable. $Xa_1$ is preferably a hydrogen atom, a methyl group, a trifluoromethyl group, or a hydroxymethyl group.

Examples of the divalent linking group of T include an alkylene group, an aromatic ring group, a $-COO-Rt-$ group, and an $-O-Rt-$ group. In the formulae, Rt represents an alkylene group or a cycloalkylene group.

T is preferably the single bond or the $-COO-Rt-$ group. In a case where T represents the $-COO-Rt-$ group, Rt is preferably an alkylene group having 1 to 5 carbon atoms, and more preferably a $-CH_2-$ group, a $-(CH_2)_2-$ group, or a $-(CH_2)_3-$ group.

As the alkyl group of each of $Rx_1$ to $Rx_3$, an alkyl group having 1 to 4 carbon atoms, such as a methyl group, an ethyl group, an n-propyl group, an isopropyl group, an n-butyl group, an isobutyl group, and a t-butyl group, is preferable.

As the cycloalkyl group of each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by the bonding of two of $Rx_1$ to $Rx_3$, a monocyclic cycloalkyl group such as a cyclopentyl group and a cyclohexyl group is preferable, and in addition, a polycyclic cycloalkyl group such as a norbornyl group, a tetracyclodecanyl group, a tetracyclododecanyl group, and an adamantyl group is also preferable. Among those, a monocyclic cycloalkyl group having 5 or 6 carbon atoms is preferable.

In the cycloalkyl group formed by the bonding of two of $Rx_1$ to $Rx_3$, for example, one of the methylene groups constituting the ring may be substituted with a heteroatom such as an oxygen atom, or a group having a heteroatom, such as a carbonyl group.

With regard to the repeating unit represented by General Formula (AI), for example, an aspect in which $Rx_1$ is a methyl group or an ethyl group, and $Rx_2$ and $Rx_3$ are bonded to each other to form the above-mentioned cycloalkyl group is preferable.

In a case where each of the groups has a substituent, examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms). The substituent preferably has 8 or less carbon atoms.

The repeating unit represented by General Formula (AI) is preferably an acid-decomposable tertiary alkyl (meth) acrylate ester-based repeating unit (the repeating unit in which $Xa_1$ represents a hydrogen atom or a methyl group, and T represents a single bond).

The resin (A) may have one kind of the repeating unit (A-a) alone or may have two or more kinds thereof.

A content of the repeating unit (A-a) (a total content in a case where two or more kinds of the repeating units (A-a) are present) is preferably 15% to 80% by mole, and more preferably 20% to 70% by mole with respect to all the repeating units in the resin (A).

The resin (A) preferably has at least one repeating unit selected from the group consisting of repeating units represented by General Formulae (A-VIII) to (A-XII) as the repeating unit (A-a).

(A-VIII)

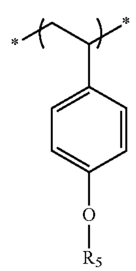

(A-IX)

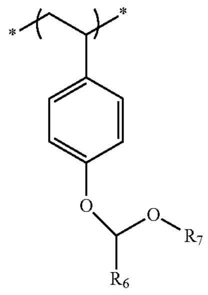

-continued (A-X)

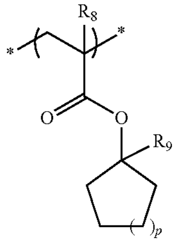

(A-XI)

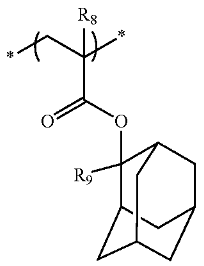

(A-XII)

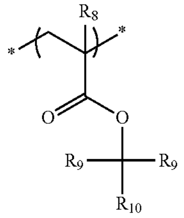

In General Formula (A-VIII), $R_5$ represents a tert-butyl group, a 1,1'-dimethylpropyl group, or a —CO—O-(tert-butyl) group.

In General Formula (A-IX), $R_6$ and $R_7$ each independently represent a monovalent substituent. Examples of the monovalent substituent include an alkyl group, a cycloalkyl group, an aryl group, an aralkyl group, and an alkenyl group.

In General Formula (A-X), p represents 1 or 2.

In General Formulae (A-X) to (A-XII), $R_8$ represents a hydrogen atom or an alkyl group having 1 to 3 carbon atoms, and $R_9$ represents an alkyl group having 1 to 3 carbon atoms.

In General Formula (A-XII), $R_{10}$ represents an alkyl group having 1 to 3 carbon atoms or an adamantyl group.

The resin (A) may have, in addition to the repeating unit (A-a) having an acid-decomposable group, a repeating unit having a polar group such as an acid group, a lactone structure, a sultone structure, a carbonate structure, and a hydroxyadamantane structure.

(Repeating Unit Having Acid Group)

The resin (A) may have a repeating unit having an acid group.

As the repeating unit having an acid group, a repeating unit represented by General Formula (B) is preferable.

(B)

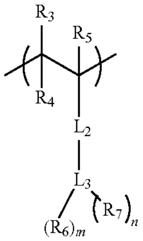

$R_3$ represents a hydrogen atom or a monovalent substituent which may have a fluorine atom or an iodine atom. The monovalent substituent which may have a fluorine atom or an iodine atom is preferably a group represented by $-L_4-R_8$. $L_4$ represents a single bond or an ester group. $R_8$ is an alkyl group which may have a fluorine atom or an iodine atom, a cycloalkyl group which may have a fluorine atom or an iodine atom, an aryl group which may have a fluorine atom or an iodine atom, or a group formed by combination thereof.

$R_4$ and $R_5$ each independently represent a hydrogen atom, a fluorine atom, an iodine atom, or an alkyl group which may have a fluorine atom or an iodine atom.

$L_2$ represents a single bond or an ester group.

$L_3$ represents an (n+m+1)-valent aromatic hydrocarbon ring group or an (n+m+1)-valent alicyclic hydrocarbon ring group. Examples of the aromatic hydrocarbon ring group include a benzene ring group and a naphthalene ring group. The alicyclic hydrocarbon ring group may be a monocycle or a polycycle, and examples thereof include a cycloalkyl ring group.

$R_6$ represents a hydroxyl group or a fluorinated alcohol group (preferably a hexafluoroisopropanol group). Furthermore, in a case where $R_6$ is a hydroxyl group, $L_3$ is preferably the (n+m+1)-valent aromatic hydrocarbon ring group.

$R_7$ represents a halogen atom. Examples of the halogen atom include a fluorine atom, a chlorine atom, a bromine atom, or an iodine atom.

m represents an integer of 1 or more. m is preferably an integer of 1 to 3 and more preferably an integer of 1 or 2.

n represents 0 or an integer of 1 or more. n is preferably an integer of 1 to 4.

Furthermore, (n+m+1) is preferably an integer of 1 to 5.

As the repeating unit having an acid group, a repeating unit represented by General Formula (I) is also preferable.

(I)

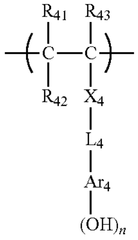

In General Formula (I), $R_{41}$, $R_{42}$, and $R_{43}$ each independently represent a hydrogen atom, an alkyl group, a cycloalkyl group, a halogen atom, a cyano group, or an alkoxycarbonyl group. It should be noted that $R_{42}$ may be bonded to $Ar_4$ to form a ring, in which case $R_{42}$ represents a single bond or an alkylene group.

$X_4$ represents a single bond, —COO—, or —$CONR_{64}$—, and $R_{64}$ represents a hydrogen atom or an alkyl group.

$L_4$ represents a single bond or an alkylene group.

$Ar_4$ represents an (n+1)-valent aromatic ring group, and in a case where $Ar_4$ is bonded to $R_{42}$ to form a ring, $Ar_4$ represents an (n+2)-valent aromatic ring group.

n represents an integer of 1 to 5.

As the alkyl group represented by each of $R_{41}$, $R_{42}$, and $R_{43}$ in General Formula (I), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group is preferable, an alkyl group having 8 or less carbon atoms is more preferable, and an alkyl group having 3 or less carbon atoms is still more preferable.

The cycloalkyl group of each of $R_{41}$, $R_{42}$, and $R_{43}$ in General Formula (I) may be monocyclic or polycyclic. Among those, a monocyclic cycloalkyl group having 3 to 8 carbon atoms, such as a cyclopropyl group, a cyclopentyl group, and a cyclohexyl group, is preferable.

Examples of the halogen atom of each of $R_{41}$, $R_{42}$, and $R_{43}$ in General Formula (I) include a fluorine atom, a chlorine atom, a bromine atom, and an iodine atom, and the fluorine atom is preferable.

As the alkyl group included in the alkoxycarbonyl group of each of $R_{41}$, $R_{42}$, and $R_{43}$ in General Formula (I), the same ones as the alkyl group in each of $R_{41}$, $R_{42}$, and $R_{43}$ are preferable.

$Ar_4$ represents an (n+1)-valent aromatic ring group. The divalent aromatic ring group in a case where n is 1 may have a substituent, and is preferably, for example, an arylene group having 6 to 18 carbon atoms, such as a phenylene group, a tolylene group, a naphthylene group, and an anthracenylene group, or an aromatic ring group including a heterocyclic ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring.

Specific examples of the (n+1)-valent aromatic ring group in a case where n is an integer of 2 or more include groups formed by removing any (n−1) hydrogen atoms from the above-mentioned specific examples of the divalent aromatic ring group. The (n+1)-valent aromatic ring group may further have a substituent.

Examples of the substituent which can be contained in the alkyl group, the cycloalkyl group, the alkoxycarbonyl group, the alkylene group, and the (n+1)-valent aromatic ring group, each mentioned above, include the alkyl groups; the alkoxy groups such as a methoxy group, an ethoxy group, a hydroxyethoxy group, a propoxy group, a hydroxypropoxy group, and a butoxy group; the aryl groups such as a phenyl group; and the like, as mentioned for each of $R_{41}$, $R_{42}$, and $R_{43}$ in General Formula (I).

Examples of the alkyl group of $R_{64}$ in —$CONR_{64}$— represented by $X_4$ ($R_{64}$ represents a hydrogen atom or an alkyl group) include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, and an alkyl group having 8 or less carbon atoms, is preferable.

As $X_4$, a single bond, —COO—, or —CONH— is preferable, and the single bond or —COO— is more preferable.

As the alkylene group in $L_4$, an alkylene group having 1 to 8 carbon atoms, such as a methylene group, an ethylene group, a propylene group, a butylene group, a hexylene group, and an octylene group, is preferable.

As $Ar_4$, an aromatic ring group having 6 to 18 carbon atoms is preferable, and a benzene ring group, a naphthalene ring group, and a biphenylene ring group are more preferable.

Specific examples of the repeating unit represented by General Formula (I) will be shown below, but the present invention is not limited thereto. In the formulae, a represents 1, 2, or 3.

(B-1)

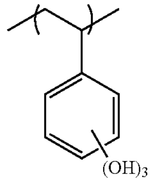

(B-2)

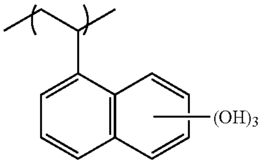

(B-3)

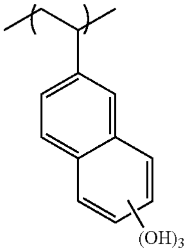

(B-4)

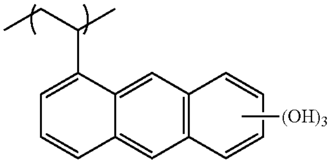

(B-5)

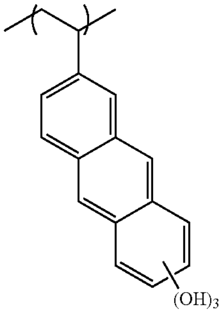

-continued (B-6)

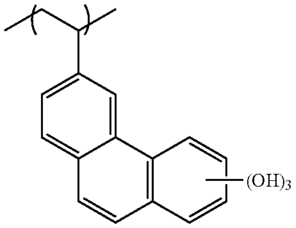

(B-7)

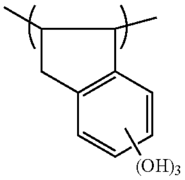

(B-8)

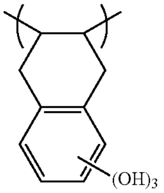

(B-9)

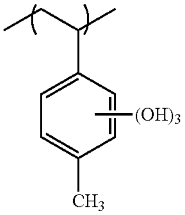

(B-10)

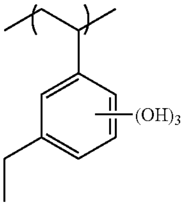

(B-11)

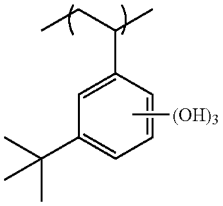

(B-12)

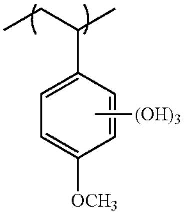

-continued
(B-13)
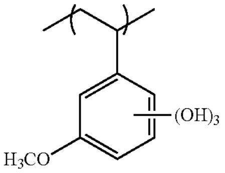
(B-14)
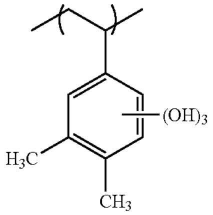
(B-15)
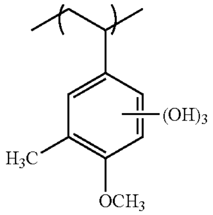
(B-16)
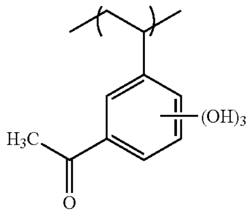
(B-17)
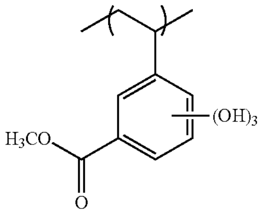
(B-18)
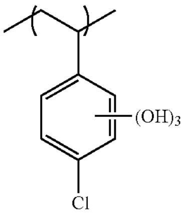
(B-19)
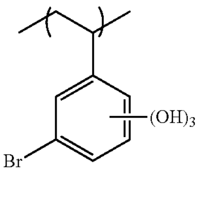
-continued
(B-20)
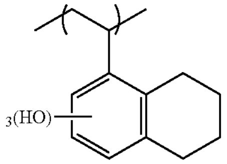
(B-21)
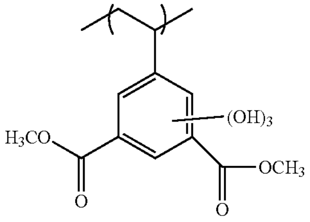
(B-22)
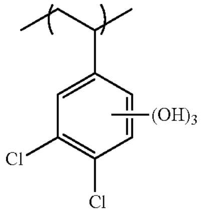
(B-23)
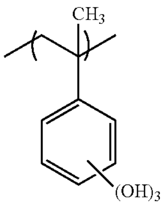
(B-24)
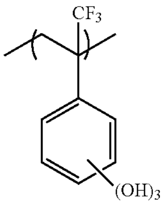
(B-25)
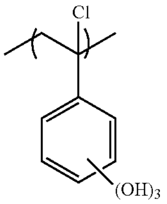
(B-26)
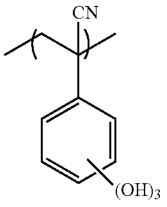

-continued
(B-27)
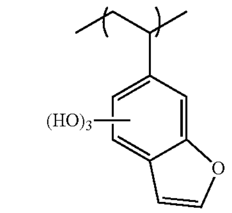
(B-28)
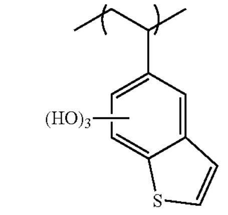
(B-29)
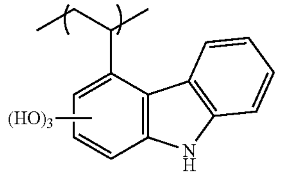
(B-30)
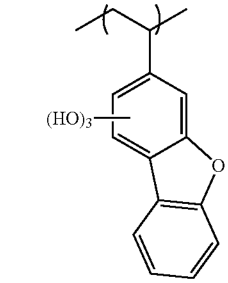
(B-31)
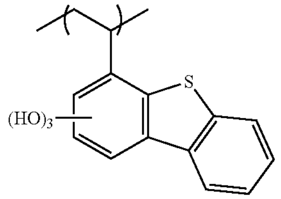
(B-32)
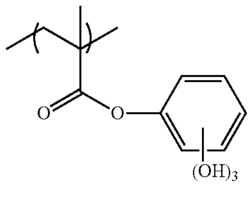
(B-33)
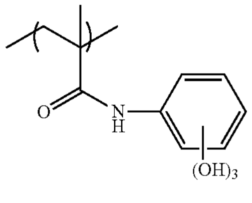
-continued
(B-34)
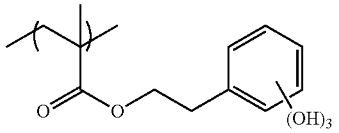
(B-35)
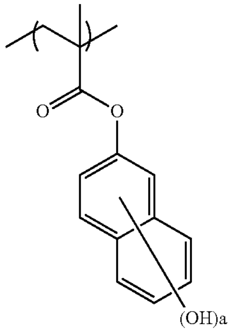
(B-36)
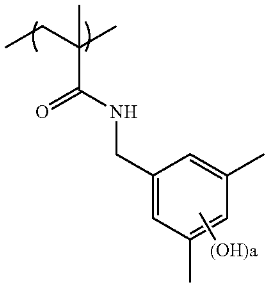
(B-37)
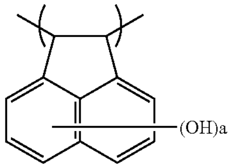
(B-38)
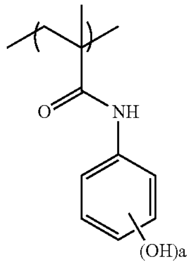
(Repeating Unit Derived from Hydroxystyrene (A-1))
The resin (A) preferably has a repeating unit (A-1) derived from hydroxystyrene as the repeating unit having an acid group.
Examples of the repeating unit (A-1) derived from hydroxystyrene include a repeating unit represented by General Formula (1).

(1)

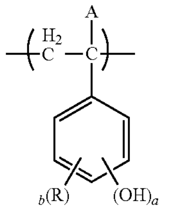

In General Formula (1),

A represents a hydrogen atom, an alkyl group, a cycloalkyl group, a halogen atom, or a cyano group.

R represents a halogen atom, an alkyl group, a cycloalkyl group, an aryl group, an alkenyl group, an aralkyl group, an alkoxy group, an alkylcarbonyloxy group, an alkylsulfonyloxy group, an alkyloxycarbonyl group, or an aryloxycarbonyl group, and in a case where a plurality of R's are present, R's may be the same as or different from each other. In a case where there are a plurality of R's, R's may be bonded to each other to form a ring. As R, the hydrogen atom is preferable.

a represents an integer of 1 to 3, and b represents an integer of 0 to (5-a).

As the repeating unit (A-1), a repeating unit represented by General Formula (A-I) is preferable.

(A-1)

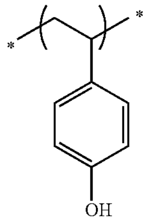

(A-1)

The composition containing the resin (A) having the repeating unit (A-1) is preferable for KrF exposure, EB exposure, or EUV exposure. A content of the repeating unit (A-1) in such a case is preferably 30% to 99% by mole, more preferably 40% to 99% by mole, and still more preferably 50% to 99% by mole with respect to all the repeating units in the resin (A).

(Repeating unit (A-2) Having at Least One selected from Group Consisting of Lactone Structure, Sultone Structure, Carbonate Structure, and Hydroxyadamantane Structure)

The resin (A) may have a repeating unit (A-2) having at least one selected from the group consisting of a lactone structure, a carbonate structure, a sultone structure, and a hydroxyadamantane structure.

The lactone structure or the sultone structure in a repeating unit having the lactone structure or the sultone structure is not particularly limited, but is preferably a 5- to 7-membered ring lactone structure or a 5- to 7-membered ring sultone structure, and more preferably a 5- to 7-membered ring lactone structure to which another ring structure is fused to form a bicyclo structure or a spiro structure, or a 5- to 7-membered ring sultone structure to which another ring structure is fused so as to form a bicyclo structure or a spiro structure.

Examples of the repeating unit having the lactone structure or the sultone structure include the repeating units described in paragraphs 0094 to 0107 of WO2016/136354A.

The resin (A) may have a repeating unit having a carbonate structure. The carbonate structure is preferably a cyclic carbonic acid ester structure.

Examples of the repeating unit having a carbonate structure include the repeating unit described in paragraphs 0106 to 0108 of WO2019/054311A.

The resin (A) may have a repeating unit having a hydroxyadamantane structure. Examples of the repeating unit having a hydroxyadamantane structure include a repeating unit represented by General Formula (AIIa).

(AIIa)

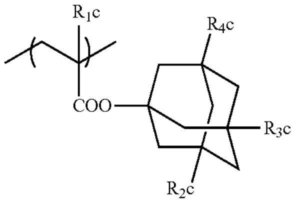

In General Formula (AIIa), Ric represents a hydrogen atom, a methyl group, a trifluoromethyl group, or a hydroxymethyl group. $R_2c$ to $R_4c$ each independently represent a hydrogen atom or a hydroxyl group. It should be noted that at least one of $R_2c$, . . . , or $R_4c$ represents a hydroxyl group. It is preferable that one or two of $R_2c$ to $R_4c$ are hydroxyl groups, and the rest are hydrogen atoms.

(Repeating Unit Having Fluorine Atom or Iodine Atom)

The resin (A) may have a repeating unit having a fluorine atom or an iodine atom.

Examples of the repeating unit having a fluorine atom or an iodine atom include the repeating units described in paragraphs 0080 and 0081 of JP2019-045864A.

(Repeating Unit Having Photoacid Generating Group)

The resin (A) may have, as a repeating unit other than those above, a repeating unit having a group that generates an acid upon irradiation with actinic rays or radiation.

Examples of the repeating unit having a fluorine atom or an iodine atom include the repeating units described in paragraphs 0092 to 0096 of JP2019-045864A.

(Repeating Unit Having Alkali-Soluble Group)

The resin (A) may have a repeating unit having an alkali-soluble group.

Examples of the alkali-soluble group include a carboxyl group, a sulfonamide group, a sulfonylimide group, a bissulfonylimide group, or an aliphatic alcohol group (for example, a hexafluoroisopropanol group) in which the α-position is substituted with an electron withdrawing group, and the carboxyl group is preferable. By allowing the resin (A) to have a repeating unit having an alkali-soluble group, the resolution for use in contact holes increases.

Examples of the repeating unit having an alkali-soluble group include a repeating unit in which an alkali-soluble group is directly bonded to the main chain of a resin such as a repeating unit with acrylic acid and methacrylic acid, or a repeating unit in which an alkali-soluble group is bonded to the main chain of the resin through a linking group. Furthermore, the linking group may have a monocyclic or polycyclic cyclic hydrocarbon structure.

The repeating unit having an alkali-soluble group is preferably a repeating unit with acrylic acid or methacrylic acid.

(Repeating Unit Having Neither Acid-Decomposable Group nor Polar Group)

The resin (A) may further have a repeating unit having neither an acid-decomposable group nor a polar group. The repeating unit having neither an acid-decomposable group nor a polar group preferably has an alicyclic hydrocarbon structure.

Examples of the repeating unit having neither an acid-decomposable group nor a polar group include the repeating units described in paragraphs 0236 and 0237 of the specification of US2016/0026083A and the repeating units described in paragraph 0433 of the specification of US2016/0070167A.

(Repeating Unit Represented by General Formula (1))

The resin (A) preferably has a repeating unit represented by General Formula (1).

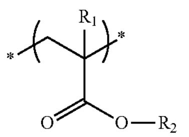

(1)

In General Formula (1), $R_1$ represents a hydrogen atom, a halogen atom, or an alkyl group. $R_2$ represents an alkyl group having 2 or more carbon atoms.

Examples of the halogen atom of $R_1$ include a fluorine atom, a chlorine atom, a bromine atom, or an iodine atom.

The alkyl group of $R_1$ is not particularly limited, but examples thereof include linear or branched alkyl groups, an alkyl group having 1 to 10 carbon atoms is preferable, and an alkyl group having 1 to 5 carbon atoms is more preferable.

The alkyl group having 2 or more carbon atoms of $R_2$ is not particularly limited, but examples thereof include linear or branched alkyl groups, an alkyl group having 2 to 20 carbon atoms is preferable, and an alkyl group having 2 to 10 carbon atoms is more preferable.

The alkyl group may have a heteroatom such as an oxygen atom, but does not form an acid-decomposable group.

In a preferred aspect, it is preferable that the resin (A) includes a repeating unit having an acid-decomposable group and a repeating unit represented by General Formula (1), and the resin (A) has an aromatic ring group.

The aromatic ring in the aromatic ring group is not particularly limited, and examples thereof include a monocyclic or polycyclic aromatic ring, such as an aromatic ring having 6 to 20 carbon atoms.

The resin (A) may have a variety of repeating structural units, in addition to the repeating structural units described above, for the purpose of adjusting dry etching resistance, suitability for a standard developer, adhesiveness to a substrate, a resist profile, resolving power, heat resistance, sensitivity, and the like.

(Characteristics of Resin (A))

In the resin (A), all the repeating units are preferably composed of repeating units derived from a (meth)acrylate-based monomer (monomer having a (meth)acryl group). In this case, any of a resin in which all the repeating units are derived from a methacrylate-based monomer, a resin in which all the repeating units are derived from an acrylate-based monomer, and a resin in which all the repeating units are derived from a methacrylate-based monomer and an acrylate-based monomer may be used. The repeating units derived from the acrylate-based monomer are preferably 50% by mole or less with respect to all the repeating units in the resin (A).

In a case where the composition of the present invention is for argon fluoride (ArF) exposure, it is preferable that the resin (A) does not substantially have an aromatic group from the viewpoint of the transmittance of ArF light. More specifically, the repeating unit having an aromatic group is preferably 5% by mole or less, more preferably 3% by mole or less, and ideally 0% by mole with respect to all the repeating units in the resin (A), that is, it is still more preferable that the repeating unit having an aromatic group is not included.

In addition, in a case where the composition of the present invention is for ArF exposure, the resin (A) preferably has a monocyclic or polycyclic alicyclic hydrocarbon structure, and preferably does not include either a fluorine atom or a silicon atom.

In a case where the composition of the present invention is for krypton fluoride (KrF) exposure, EB exposure, or EUV exposure, the resin (A) preferably has a repeating unit having an aromatic hydrocarbon group, and more preferably has a repeating unit having a phenolic hydroxyl group.

Examples of the repeating unit having a phenolic hydroxyl group include a repeating unit derived from hydroxystyrene (A-1) and a repeating unit derived from hydroxystyrene (meth)acrylate.

In addition, in a case where the composition of the present invention is for KrF exposure, EB exposure, or EUV exposure, it is also preferable that the resin (A) has a repeating unit having a structure in which a hydrogen atom of the phenolic hydroxyl group is protected by a group (leaving group) that leaves through decomposition by the action of an acid.

In a case where the composition of the present invention is for KrF exposure, EB exposure, or EUV exposure, a content of the repeating unit having an aromatic hydrocarbon group included in the resin (A) is preferably 30% to 100% by mole, more preferably 40% to 100% by mole, and still more preferably 50% to 100% by mole, with respect to all the repeating units in the resin (A).

The resin (A) can be synthesized in accordance with an ordinary method (for example, radical polymerization).

The weight-average molecular weight (Mw) of the resin (A) is preferably 1,000 to 200,000, more preferably 3,000 to 20,000, and still more preferably 5,000 to 15,000. By setting the weight-average molecular weight (Mw) of the resin (A) to 1,000 to 200,000, it is possible to prevent deterioration of heat resistance and dry etching resistance, and it is also possible to prevent deterioration of the film forming property due to deterioration of developability and an increase in the viscosity. Incidentally, the weight-average molecular weight (Mw) of the resin (A) is a value expressed in terms of polystyrene as measured by the above-mentioned GPC method.

The dispersity (molecular weight distribution) of the resin (A) is usually 1 to 5, preferably 1 to 3, and more preferably 1.1 to 2.0. The smaller the dispersity, the better the resolution and the resist shape, the smoother the side wall of a pattern, and the more excellent the roughness.

In the composition of the present invention, a content of the resin (A) is preferably 50% to 99.9% by mass, and more preferably 60% to 99.0% by mass with respect to the total solid content of the composition.

In addition, the resin (A) may be used alone or in combination of two or more kinds thereof.

Moreover, in the present specification, the solid content means components other than the solvent. Even in a case where the properties of the components are liquid, they are treated as solid contents.

<Photoacid Generator (P)>

The composition of the present invention contains a photoacid generator (P). The photoacid generator (P) is not particularly limited as long as it is a compound that generates an acid upon irradiation with actinic rays or radiation.

The photoacid generator (P) may be in a form of a low-molecular-weight compound or a form incorporated into a part of a polymer. In addition, a combination of the form of a low-molecular-weight compound and the form incorporated into a part of a polymer may also be used.

In a case where the photoacid generator (P) is in the form of the low-molecular-weight compound, the weight-average molecular weight (Mw) is preferably 3,000 or less, more preferably 2,000 or less, and still more preferably 1,000 or less.

In a case where the photoacid generator (P) is in the form incorporated into a part of a polymer, it may be incorporated into the part of the resin (A) or into a resin that is different from the resin (A).

In the present invention, the photoacid generator (P) is preferably in the form of a low-molecular-weight compound.

The photoacid generator (P) is not particularly limited as long as it is a known one, but a compound that generates an organic acid upon irradiation with actinic rays or radiation is preferable, and a photoacid generator having a fluorine atom or an iodine atom in the molecule is more preferable.

Examples of the organic acid include sulfonic acids (an aliphatic sulfonic acid, an aromatic sulfonic acid, and a camphor sulfonic acid), carboxylic acids (an aliphatic carboxylic acid, an aromatic carboxylic acid, and an aralkylcarboxylic acid), a carbonylsulfonylimide acid, a bis(alkylsulfonyl)imide acid, and a tris(alkylsulfonyl)methide acid.

The volume of an acid generated from the photoacid generator (P) is not particularly limited, but from the viewpoint of suppressing the diffusion of the acid generated upon exposure into the unexposed area and improving the resolution, the volume is preferably 240 Å$^3$ or more, more preferably 305 Å$^3$ or more, still more preferably 350 Å$^3$ or more, and particularly preferably 400 Å$^3$ or more. Incidentally, from the viewpoint of the sensitivity or the solubility in an application solvent, the volume of the acid generated from the photoacid generator (P) is preferably 1,500 Å$^3$ or less, more preferably 1,000 Å$^3$ or less, and still more preferably 700 Å$^3$ or less.

The value of the volume is obtained using "WinMOPAC" manufactured by Fujitsu Limited. For the computation of the value of the volume, first, the chemical structure of the acid according to each example is input, next, using this structure as the initial structure, the most stable conformation of each acid is determined by molecular force field computation using a Molecular Mechanics (MM) 3 method, and thereafter, with respect to the most stable conformation, molecular orbital computation using a parameterized model number (PM) 3 method is performed, whereby the "accessible volume" of each acid can be computed.

The structure of an acid generated from the photoacid generator (P) is not particularly limited, but from the viewpoint that the diffusion of the acid is suppressed and the resolution is improved, it is preferable that the interaction between the acid generated from the photoacid generator (P) and the resin (A) is strong. From this viewpoint, in a case where the acid generated from the photoacid generator (P) is an organic acid, it is preferable that a polar group is further contained, in addition to an organic acid group such as a sulfonic acid group, a carboxylic acid group, a carbonylsulfonylimide acid group, a bissulfonylimide acid group, and a trissulfonylmethide acid group.

Examples of the polar group include an ether group, an ester group, an amide group, an acyl group, a sulfo group, a sulfonyloxy group, a sulfonamide group, a thioether group, a thioester group, a urea group, a carbonate group, a carbamate group, a hydroxyl group, and a mercapto group.

The number of the polar groups contained in the acid generated is not particularly limited, and is preferably 1 or more, and more preferably 2 or more. It should be noted that from the viewpoint that excessive development is suppressed, the number of the polar groups is preferably less than 6, and more preferably less than 4.

Among those, the photoacid generator (P) is preferably a photoacid generator consisting of an anionic moiety and a cationic moiety from the viewpoint that the effect of the present invention is more excellent.

Examples of the photoacid generator (P) include the photoacid generators described in paragraphs 0144 to 0173 of JP2019-045864A.

In addition, suitable aspects of the photoacid generator (P) include compounds represented by General Formulae (ZI), (ZII), and (ZIII).

(ZI)

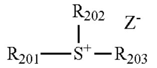

(ZII)

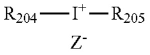

(ZIII)

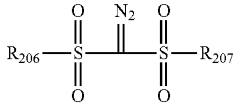

In General Formula (ZI), $R_{201}$, $R_{202}$, and $R_{203}$ each independently represent an organic group.

The organic group as each of $R_{201}$, $R_{202}$, and $R_{203}$ generally has 1 to 30 carbon atoms, and preferably has 1 to 20 carbon atoms.

In addition, two of $R_{201}$ to $R_{203}$ may be bonded to each other to form a ring structure, and the ring may include an oxygen atom, a sulfur atom, an ester bond, an amide bond, or a carbonyl group. Examples of the group formed by the bonding of two of $R_{201}$ to $R_{203}$ include an alkylene group (for example, a butylene group and a pentylene group), and $-CH_2-CH_2-O-CH_2-CH_2-$.

$Z^-$ represents an anion.

Suitable aspects of the cation in General Formula (ZI) include the corresponding groups in compounds (ZI-1), (ZI-2), (ZI-3), and (ZI-4) which will be described later.

Furthermore, the photoacid generator (B) may be a compound having a plurality of structures represented by General Formula (ZI). For example, the photoacid generator may be a compound having a structure in which at least one of $R_{201}$, $R_{202}$, or $R_{203}$ of the compound represented by General Formula (ZI) and at least one of $R_{201}$, $R_{202}$, or $R_{203}$ of another compound represented by General Formula (ZI) are bonded through a single bond or a linking group.

First, the compound (ZI-1) will be described.

The compound (ZI-1) is an arylsulfonium compound in which at least one of $R_{201}$, $R_{202}$, or $R_{203}$ in General Formula (ZI) is an aryl group, that is, a compound having arylsulfonium as a cation.

In the arylsulfonium compound, all of $R_{201}$ to $R_{203}$ may be aryl groups, or some of $R_{201}$ to $R_{203}$ may be an aryl group, and the rest may be an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

As the aryl group of the arylsulfonium compound, a phenyl group or a naphthyl group is preferable, and the phenyl group is more preferable. The aryl group may be an aryl group which has a heterocyclic structure having an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium compound has two or more aryl groups, the two or more aryl groups may be the same as or different from each other.

The alkyl group or the cycloalkyl group contained in the arylsulfonium compound, as necessary, is preferably a linear alkyl group having 1 to 15 carbon atoms, a branched alkyl group having 3 to 15 carbon atoms, or a cycloalkyl group having 3 to 15 carbon atoms, and examples thereof include a methyl group, an ethyl group, a propyl group, an n-butyl group, a sec-butyl group, a t-butyl group, a cyclopropyl group, a cyclobutyl group, and a cyclohexyl group.

The aryl group, the alkyl group, and the cycloalkyl group of each of $R_{201}$ to $R_{203}$ may each independently have an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a halogen atom, a hydroxyl group, or a phenylthio group as a substituent.

Next, the compound (ZI-2) will be described.

The compound (ZI-2) is a compound in which $R_{201}$ to $R_{203}$ in Formula (ZI) each independently represent an organic group not having an aromatic ring. Here, the aromatic ring also includes an aromatic ring containing a heteroatom.

The organic group having no aromatic ring as each of $R_{201}$ to $R_{203}$ generally has 1 to 30 carbon atoms, and preferably has 1 to 20 carbon atoms.

$R_{201}$ to $R_{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and still more preferably the linear or branched 2-oxoalkyl group.

Preferred examples of the alkyl group and the cycloalkyl group of each of $R_{201}$ to $R_{203}$ include a linear alkyl group having 1 to 10 carbon atoms or branched alkyl group having 3 to 10 carbon atoms (for example, a methyl group, an ethyl group, a propyl group, a butyl group, and a pentyl group), or a cycloalkyl group having 3 to 10 carbon atoms (for example, a cyclopentyl group, a cyclohexyl group, and a norbornyl group).

$R_{201}$ to $R_{203}$ may be further substituted with a halogen atom, an alkoxy group (for example, having 1 to 5 carbon atoms), a hydroxyl group, a cyano group, or a nitro group.

Next, the compound (ZI-3) will be described.

The compound (ZI-3) is a compound represented by General Formula (ZI-3), which is a compound having a phenacylsulfonium salt structure.

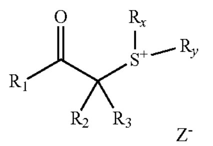

(ZI-3)

In General Formula (ZI-3), $R_1$ represents an alkyl group, a cycloalkyl group, an alkoxy group, a cycloalkoxy group, an aryl group, or an alkenyl group. $R_2$ and $R_3$ each independently represent a hydrogen atom, an alkyl group, a cycloalkyl group, an alkoxy group, a cycloalkoxy group, or an aryl group. $R_2$ and $R_3$ may be linked to each other to form a ring. $R_1$ and $R_2$ may be linked to each other to form a ring. $R_x$ and $R_y$ each independently represent an alkyl group, a cycloalkyl group, an alkenyl group, an aryl group, a 2-oxoalkyl group, a 2-oxocycloalkyl group, an alkoxycarbonylalkyl group, or an alkoxycarbonylcycloalkyl group. $R_x$ and $R_y$ may be linked to each other to form a ring, and the ring structure may include an oxygen atom, a nitrogen atom, a sulfur atom, a ketone group, an ether bond, an ester bond, or an amide bond. Z-represents an anion.

The alkyl group as $R_1$ is not particularly limited, but may be linear or branched, and is preferably an alkyl group having 1 to 20 carbon atoms, more preferably an alkyl group having 1 to 15 carbon atoms, and still more preferably an alkyl group having 1 to 10 carbon atoms.

The alkyl group may have a substituent. The substituent is not particularly limited, but examples thereof include the above-mentioned substituent T.

The cycloalkyl group as $R_1$ is not particularly limited, but may be a monocycle or a polycycle, and is preferably a cycloalkyl group having 3 to 20 carbon atoms, more preferably a cycloalkyl group having 3 to 15 carbon atoms, and still more preferably a cycloalkyl group having 3 to 10 carbon atoms.

Specific examples of the cycloalkyl group include a cyclopentyl group, a cyclohexyl group, and a decahydronaphthalenyl group.

The cycloalkyl group may have a substituent. The substituent is not particularly limited, but examples thereof include the above-mentioned substituent T.

The alkoxy group as $R_1$ is not particularly limited, but is preferably an alkoxy group having 1 to 20 carbon atoms, more preferably an alkoxy group having 1 to 15 carbon atoms, and still more preferably an alkoxy group having 1 to 10 carbon atoms.

The alkoxy group may have a substituent. The substituent is not particularly limited, but examples thereof include the above-mentioned substituent T.

The cycloalkoxy group as $R_1$ is not particularly limited, but is preferably a cycloalkoxy group having 3 to 20 carbon atoms, more preferably a cycloalkoxy group having 3 to 15 carbon atoms, and still more preferably a cycloalkoxy group having 3 to 10 carbon atoms.

The cycloalkoxy group may have a substituent. The substituent is not particularly limited, but examples thereof include the above-mentioned substituent T.

The aryl group as $R_1$ is not particularly limited, and may be a monocycle or a polycycle, and is preferably an aryl group having 6 to 20 carbon atoms, more preferably an aryl group having 6 to 15 carbon atoms, and still more preferably an aryl group having 6 to 10 carbon atoms.

The aryl group may have a substituent. The substituent is not particularly limited, but examples thereof include the above-mentioned substituent T, but the alkoxy group is preferable.

The alkenyl group as $R_1$ is not particularly limited, but is preferably an alkenyl group having 1 to 20 carbon atoms, more preferably an alkenyl group having 1 to 15 carbon atoms, and still more preferably an alkenyl group having 1 to 10 carbon atoms.

The alkenyl group may have a substituent. The substituent is not particularly limited, but examples thereof include the above-mentioned substituent T.

$R_1$ is preferably an aryl group.

The alkyl group as each of $R_2$ and $R_3$ is not particularly limited, but may be linear or branched, and is preferably an alkyl group having 1 to 20 carbon atoms, more preferably an alkyl group having 1 to 15 carbon atoms, and still more preferably an alkyl group having 1 to 10 carbon atoms.

The alkyl group may have a substituent. The substituent is not particularly limited, but examples thereof include the above-mentioned substituent T.

The cycloalkyl group as each of $R_2$ and $R_3$ is not particularly limited, but may be a monocycle or a polycycle, and is preferably a cycloalkyl group having 3 to 20 carbon atoms, more preferably a cycloalkyl group having 3 to 15 carbon atoms, and still more preferably a cycloalkyl group having 3 to 10 carbon atoms.

Specific examples of the cycloalkyl group include a cyclopentyl group, a cyclohexyl group, and a decahydronaphthalenyl group.

The cycloalkyl group may have a substituent. The substituent is not particularly limited, but examples thereof include the above-mentioned substituent T.

The aryl group as each of $R_2$ and $R_3$ is not particularly limited, and may be a monocycle or a polycycle, and is preferably an aryl group having 6 to 20 carbon atoms, more preferably an aryl group having 6 to 15 carbon atoms, and still more preferably an aryl group having 6 to 10 carbon atoms.

The aryl group may have a substituent. The substituent is not particularly limited, but examples thereof include the above-mentioned substituent T.

The alkoxy group as each of $R_2$ and $R_3$ is not particularly limited, but is preferably an alkoxy group having 1 to 20 carbon atoms, more preferably an alkoxy group having 1 to 15 carbon atoms, and still more preferably an alkoxy group having 1 to 10 carbon atoms.

The alkoxy group may have a substituent. The substituent is not particularly limited, but examples thereof include the above-mentioned substituent T.

The cycloalkoxy group as each of $R_2$ and $R_3$ is not particularly limited, but is preferably a cycloalkoxy group having 3 to 20 carbon atoms, more preferably a cycloalkoxy group having 3 to 15 carbon atoms, and still more preferably a cycloalkoxy group having 3 to 10 carbon atoms.

The cycloalkoxy group may have a substituent. The substituent is not particularly limited, but examples thereof include the above-mentioned substituent T.

$R_2$ and $R_3$ are each independently preferably a hydrogen atom, an alkyl group, a cycloalkyl group, or an alkoxy group, and more preferably the hydrogen atom or the alkyl group.

$R_2$ and $R_3$ may be linked to each other to form a ring, examples of the ring structure include a 3 to 10-membered ring, and the ring structure is preferably a 4- to 8-membered ring, and more preferably a 5- or 6-membered ring.

In addition, $R_1$ and $R_2$ may be linked to each other to form a ring, examples of the ring structure include a 3 to 10-membered ring, and the ring structure is preferably a 4- to 8-membered ring, and more preferably a 5- or 6-membered ring.

The alkyl group as each of $R_x$ and $R_y$ is not particularly limited, but may be linear or branched, and is preferably an alkyl group having 1 to 20 carbon atoms, more preferably an alkyl group having 1 to 15 carbon atoms, and still more preferably an alkyl group having 1 to 10 carbon atoms.

The alkyl group may have a substituent. The substituent is not particularly limited, but examples thereof include the above-mentioned substituent T.

The cycloalkyl group as each of $R_x$ and $R_y$ is not particularly limited, but may be a monocycle or a polycycle, and is preferably a cycloalkyl group having 3 to 20 carbon atoms, more preferably a cycloalkyl group having 3 to 15 carbon atoms, and still more preferably a cycloalkyl group having 3 to 10 carbon atoms.

Specific examples of the cycloalkyl group include a cyclopentyl group, a cyclohexyl group, and a decahydronaphthalenyl group.

The cycloalkyl group may have a substituent. The substituent is not particularly limited, but examples thereof include the above-mentioned substituent T.

The alkenyl group as each of $R_x$ and $R_y$ is not particularly limited, but is preferably an alkenyl group having 1 to 20 carbon atoms, more preferably an alkenyl group having 1 to 15 carbon atoms, and still more preferably an alkenyl group having 1 to 10 carbon atoms.

The alkenyl group may have a substituent. The substituent is not particularly limited, but examples thereof include the above-mentioned substituent T.

The aryl group as each of $R_x$ and $R_y$ is not particularly limited, and may be a monocycle or a polycycle, and is preferably an aryl group having 6 to 20 carbon atoms, more preferably an aryl group having 6 to 15 carbon atoms, and still more preferably an aryl group having 6 to 10 carbon atoms.

The aryl group may have a substituent. The substituent is not particularly limited, but examples thereof include the above-mentioned substituent T.

The 2-oxoalkyl group as each of $R_x$ and $R_y$ is not particularly limited, but is preferably a 2-oxoalkyl group having 1 to 20 carbon atoms, more preferably 2-oxoalkyl having 1 to 15 carbon atoms, and still more preferably 2-oxoalkyl having 1 to 10 carbon atoms.

The 2-oxoalkyl group may have a substituent. The substituent is not particularly limited, but examples thereof include the above-mentioned substituent T.

The 2-oxocycloalkyl group as each of $R_x$ and $R_y$ is not particularly limited, but is preferably a 2-oxocycloalkyl group having 3 to 20 carbon atoms, more preferably a 2-oxocycloalkyl group having 3 to 15 carbon atoms, and still more preferably a 2-oxocycloalkyl group having 3 to 10 carbon atoms.

The 2-oxocycloalkyl group may have a substituent. The substituent is not particularly limited, but examples thereof include the above-mentioned substituent T.

The alkoxycarbonylalkyl group as each of $R_x$ and $R_y$ is not particularly limited, but is preferably an alkoxycarbonylalkyl group having 3 to 22 carbon atoms, more preferably an alkoxycarbonylalkyl group having 3 to 17 carbon atoms, and still more preferably an alkoxycarbonylalkyl group having 3 to 12 carbon atoms.

The alkoxycarbonylalkyl group may have a substituent. The substituent is not particularly limited, but examples thereof include the above-mentioned substituent T.

The alkoxycarbonylcycloalkyl group as each of $R_x$ and $R_y$ is not particularly limited, but is preferably an alkoxycarbonylcycloalkyl group having 5 to 24 carbon atoms, more preferably an alkoxycarbonylcycloalkyl group having 5 to 19 carbon atoms, and still more preferably an alkoxycarbonylcycloalkyl group having 5 to 14 carbon atoms.

The alkoxycarbonylcycloalkyl group may have a substituent. The substituent is not particularly limited, but examples thereof include the above-mentioned substituent T.

Rx and $R_y$ may be linked to each other to form a ring, and the ring structure may include an oxygen atom, a nitrogen atom, a sulfur atom, a ketone group, an ether bond, an ester bond, or an amide bond.

The ring structure preferably includes an oxygen atom.

Examples of the ring structure include an aromatic or non-aromatic hydrocarbon ring, an aromatic or non-aromatic heterocyclic ring, and a polycyclic fused ring in which two or more of these rings are combined. Examples of the ring structure include a 3- to 10-membered ring and the ring structure is preferably a 4- to 8-membered ring, and more preferably a 5- or 6-membered ring.

Next, the compound (ZI-4) will be described.

The compound (ZI-4) is a compound represented by General Formula (ZI-4).

(ZI-4)

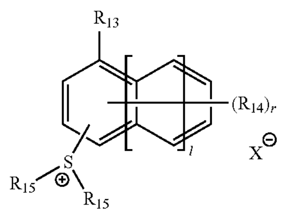

In General Formula (ZI-4), l represents an integer of 0 to 2.

r represents an integer of 0 to 8.

$R_{13}$ represents a hydrogen atom, a fluorine atom, a hydroxyl group, an alkyl group, a cycloalkyl group, an alkoxy group, or an alkoxycarbonyl group.

$R_{14}$ represents a hydroxyl group, an alkyl group, a cycloalkyl group, an alkoxy group, an alkoxycarbonyl group, an alkylcarbonyl group, an alkylsulfonyl group, or a cycloalkylsulfonyl group. In a case where a plurality of $R_{14}$'s are present, the plurality of $R_{14}$'s may be the same as or different from each other.

$R_{15}$'s each independently represent an alkyl group, a cycloalkyl group, or a naphthyl group. Two $R_{15}$'s may be bonded to each other to form a ring. In a case where two $R_{15}$'s are bonded to each other to form a ring, the ring structure may include an oxygen atom, a nitrogen atom, a sulfur atom, a ketone group, an ether bond, an ester bond, or an amide bond.

$X^-$ represents an anion.

The alkyl group as $R_{13}$ is not particularly limited, but may be linear or branched, and is preferably an alkyl group having 1 to 20 carbon atoms, more preferably an alkyl group having 1 to 15 carbon atoms, and still more preferably an alkyl group having 1 to 10 carbon atoms.

The alkyl group may have a substituent. The substituent is not particularly limited, but examples thereof include the above-mentioned substituent T.

The cycloalkyl group as $R_{13}$ is not particularly limited, but may be a monocycle or a polycycle, and is preferably a cycloalkyl group having 3 to 20 carbon atoms, more preferably a cycloalkyl group having 3 to 15 carbon atoms, and still more preferably a cycloalkyl group having 3 to 10 carbon atoms.

Specific examples of the cycloalkyl group include a cyclopentyl group, a cyclohexyl group, and a decahydronaphthalenyl group.

The cycloalkyl group may have a substituent. The substituent is not particularly limited, but examples thereof include the above-mentioned substituent T.

The alkoxy group as $R_{13}$ is not particularly limited, but is preferably an alkoxy group having 1 to 20 carbon atoms, more preferably an alkoxy group having 1 to 15 carbon atoms, and still more preferably an alkoxy group having 1 to 10 carbon atoms.

The alkoxy group may have a substituent. The substituent is not particularly limited, but examples thereof include the above-mentioned substituent T.

The alkoxycarbonyl group as $R_{13}$ is not particularly limited, but is preferably an alkoxycarbonyl group having 2 to 21 carbon atoms, more preferably an alkoxycarbonyl group having 2 to 16 carbon atoms, and still more preferably an alkoxycarbonyl group having 2 to 11 carbon atoms.

The alkoxycarbonyl group may have a substituent. The substituent is not particularly limited, but examples thereof include the above-mentioned substituent T.

The alkyl group as $R_{14}$ is not particularly limited, but may be linear or branched, and is preferably an alkyl group having 1 to 20 carbon atoms, more preferably an alkyl group having 1 to 15 carbon atoms, and still more preferably an alkyl group having 1 to 10 carbon atoms.

The alkyl group may have a substituent. The substituent is not particularly limited, but examples thereof include the above-mentioned substituent T.

The cycloalkyl group as $R_{14}$ is not particularly limited, but may be a monocycle or a polycycle, and is preferably a cycloalkyl group having 3 to 20 carbon atoms, more preferably a cycloalkyl group having 3 to 15 carbon atoms, and still more preferably a cycloalkyl group having 3 to 10 carbon atoms.

Specific examples of the cycloalkyl group include a cyclopentyl group, a cyclohexyl group, and a decahydronaphthalenyl group.

The cycloalkyl group may have a substituent. The substituent is not particularly limited, but examples thereof include the above-mentioned substituent T.

The alkoxy group as $R_{14}$ is not particularly limited, but is preferably an alkoxy group having 1 to 20 carbon atoms, more preferably an alkoxy group having 1 to 15 carbon atoms, and still more preferably an alkoxy group having 1 to 10 carbon atoms.

The alkoxy group may have a substituent. The substituent is not particularly limited, but examples thereof include the above-mentioned substituent T.

The alkoxycarbonyl group as $R_{14}$ is not particularly limited, but is preferably an alkoxycarbonyl group having 2 to 21 carbon atoms, more preferably an alkoxycarbonyl group having 2 to 16 carbon atoms, and still more preferably an alkoxycarbonyl group having 2 to 11 carbon atoms.

The alkoxycarbonyl group may have a substituent. The substituent is not particularly limited, but examples thereof include the above-mentioned substituent T.

The alkylcarbonyl group as $R_{14}$ is not particularly limited, but is preferably an alkylcarbonyl group having 2 to 21 carbon atoms, more preferably an alkylcarbonyl group having 2 to 16 carbon atoms, and still more preferably an alkylcarbonyl group having 2 to 11 carbon atoms.

The alkylcarbonyl group may have a substituent. The substituent is not particularly limited, but examples thereof include the above-mentioned substituent T.

The alkylsulfonyl group as $R_{14}$ is not particularly limited, but is preferably an alkylsulfonyl group having 1 to 20 carbon atoms, more preferably an alkylsulfonyl group having 1 to 15 carbon atoms, and still more preferably an alkylsulfonyl group having 1 to 10 carbon atoms.

The alkylsulfonyl group may have a substituent. The substituent is not particularly limited, but examples thereof include the above-mentioned substituent T.

The cycloalkylsulfonyl group as $R_{14}$ is not particularly limited, but is preferably a cycloalkylsulfonyl group having 3 to 20 carbon atoms, more preferably a cycloalkylsulfonyl group having 3 to 15 carbon atoms, and still more preferably a cycloalkylsulfonyl group having 3 to 10 carbon atoms.

The cycloalkylsulfonyl group may have a substituent. The substituent is not particularly limited, but examples thereof include the above-mentioned substituent T.

In a case where a plurality of $R_{14}$'s are present, the plurality of $R_{14}$'s may be the same as or different from each other.

The alkyl group as $R_{15}$ is not particularly limited, but may be linear or branched, and is preferably an alkyl group having 1 to 20 carbon atoms, more preferably an alkyl group having 1 to 15 carbon atoms, and still more preferably an alkyl group having 1 to 10 carbon atoms.

The alkyl group may have a substituent. The substituent is not particularly limited, but examples thereof include the above-mentioned substituent T.

The cycloalkyl group as $R_{15}$ is not particularly limited, but may be a monocycle or a polycycle, and is preferably a cycloalkyl group having 3 to 20 carbon atoms, more preferably a cycloalkyl group having 3 to 15 carbon atoms, and still more preferably a cycloalkyl group having 3 to 10 carbon atoms.

Specific examples of the cycloalkyl group include a cyclopentyl group, a cyclohexyl group, and a decahydronaphthalenyl group.

The cycloalkyl group may have a substituent. The substituent is not particularly limited, but examples thereof include the above-mentioned substituent T.

The naphthyl group as $R_{15}$ may have a substituent. The substituent is not particularly limited, but examples thereof include the above-mentioned substituent T.

Two $R_{15}$'s may be bonded to each other to form a ring. In a case where two $R_{15}$'s are bonded to each other to form a ring, the ring structure may include an oxygen atom, a nitrogen atom, a sulfur atom, a ketone group, an ether bond, an ester bond, or an amide bond.

The ring structure preferably includes an oxygen atom.

Examples of the ring structure include an aromatic or non-aromatic hydrocarbon ring, an aromatic or non-aromatic heterocyclic ring, and a polycyclic fused ring in which two or more of these rings are combined. Examples of the ring structure include a 3- to 10-membered ring and the ring structure is preferably a 4- to 8-membered ring, and more preferably a 5- or 6-membered ring.

In one preferred aspect, it is preferable that two $R_{15}$'s are alkyl groups and are bonded to each other to form a ring structure.

Next, General Formulae (ZII) and (ZIII) will be described.

In General Formulae (ZII) and (ZIII), $R_{204}$ to $R_{207}$ each independently represent an aryl group, an alkyl group, or a cycloalkyl group.

As the aryl group of each of $R_{204}$ to $R_{207}$, a phenyl group or a naphthyl group is preferable, and the phenyl group is more preferable. The aryl group of each of $R_{204}$ to $R_{207}$ may be an aryl group which has a heterocyclic structure having an oxygen atom, a nitrogen atom, a sulfur atom, or the like. Examples of the skeleton of the aryl group having a heterocyclic structure include pyrrole, furan, thiophene, indole, benzofuran, and benzothiophene.

Preferred examples of the alkyl group and the cycloalkyl group of each of $R_{204}$ to $R_{207}$ include a linear alkyl group having 1 to 10 carbon atoms or branched alkyl group having 3 to 10 carbon atoms (for example, a methyl group, an ethyl group, a propyl group, a butyl group, and a pentyl group), and a cycloalkyl group having 3 to 10 carbon atoms (for example, a cyclopentyl group, a cyclohexyl group, and a norbornyl group).

The aryl group, the alkyl group, and the cycloalkyl group of each of $R_{204}$ to $R_{207}$ may each independently have a substituent. Examples of the substituent which may be contained in each of the aryl group, the alkyl group, and the cycloalkyl group of each of $R_{204}$ to $R_{207}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

$Z^-$ represents an anion.

The photoacid generator (P) preferably includes a compound represented by General Formula (ZI-3) or a compound represented by General Formula (ZI-4).

By using such a compound, the transparency of the resist film is increased, and thus, in a case of exposure with ArF light, a more excellent resolution can be obtained.

$Z^-$ in General Formula (ZI), $Z^-$ in General Formula (ZII), $Z^-$ in General Formula (ZI-3), and $X^-$ in General Formula (ZI-4) are not particularly limited, but examples thereof include the non-nucleophilic anion Z-described in paragraphs 0144 to 0173 of JP2019-045864A.

Preferred examples of the sulfonium cation in General Formula (ZI) and the iodonium cation in General Formula (ZII) are shown below.

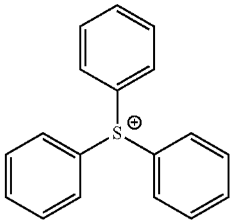

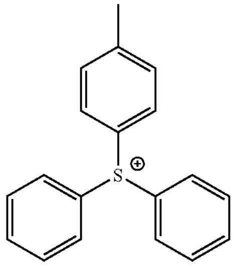

-continued
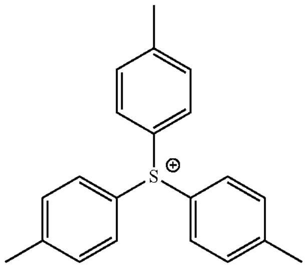
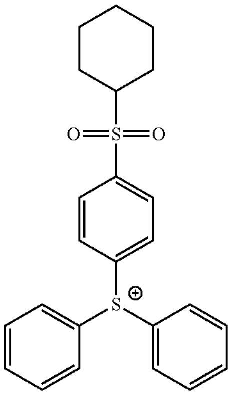
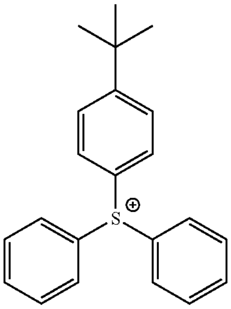
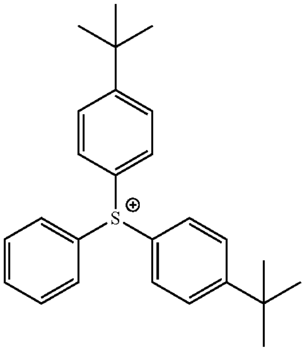
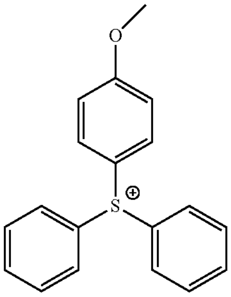
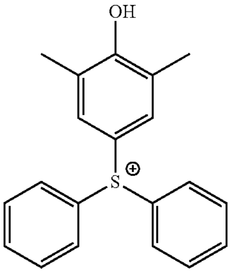
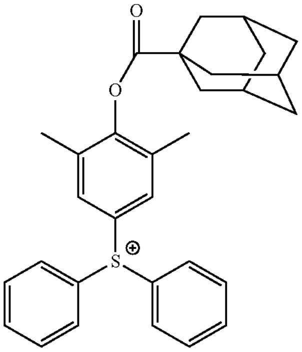
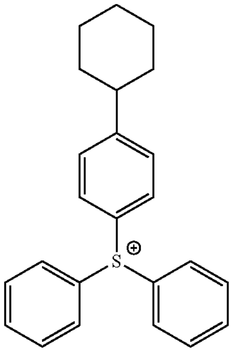
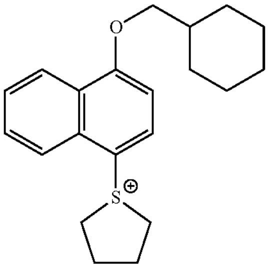
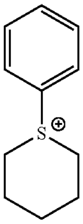
-continued
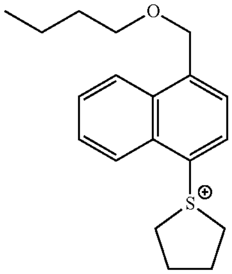
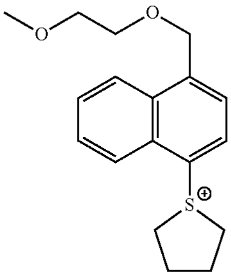
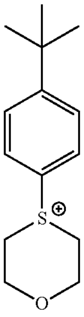
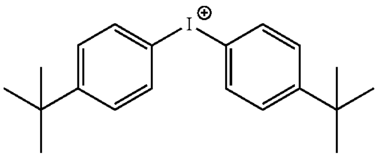
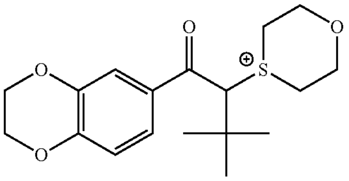
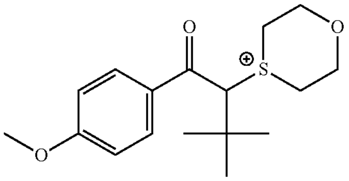
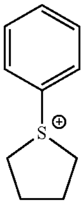
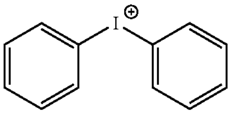
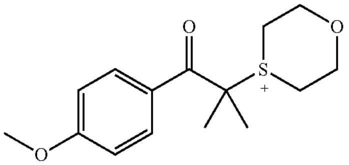
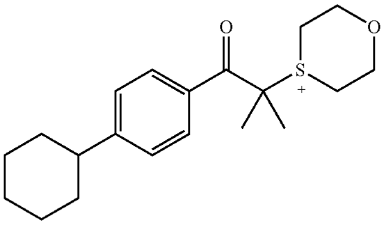
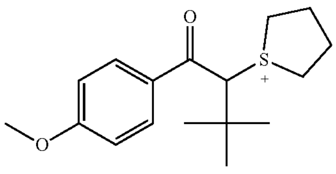

-continued
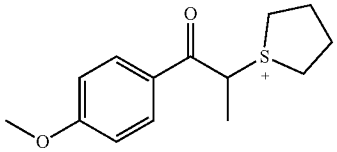
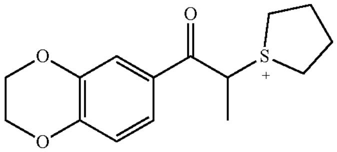
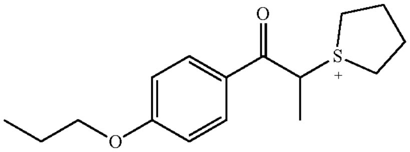
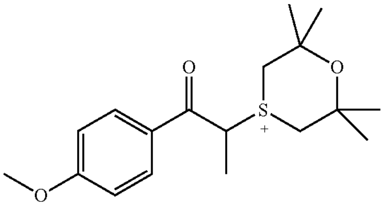
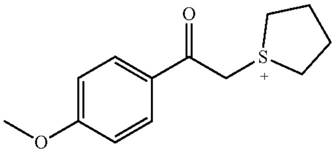
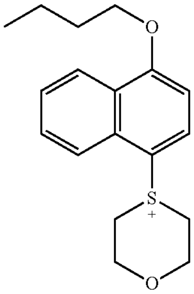
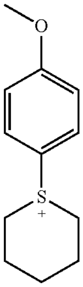
Preferred examples of the anion $Z^-$ in each of General Formula (ZI) and General Formula (ZII), $Z^-$ in General Formula (ZI-3), and $X^-$ in General Formula (ZI-4) are shown below.
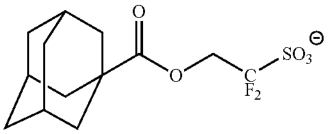
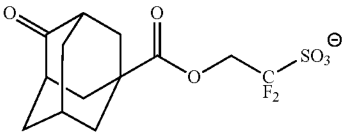
-continued
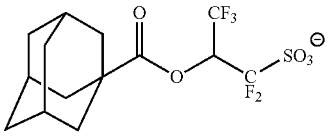
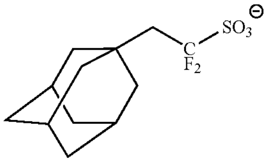
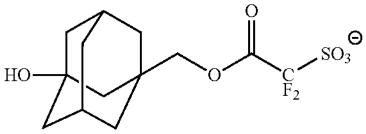
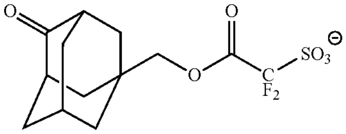
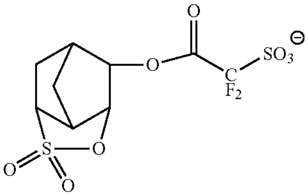
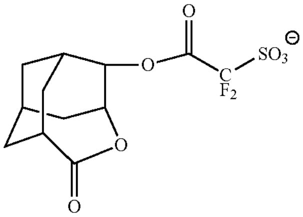
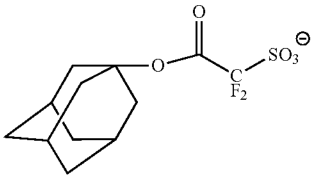
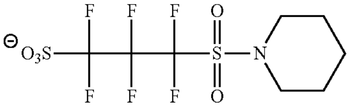
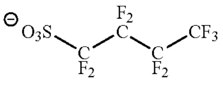
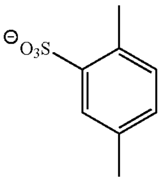
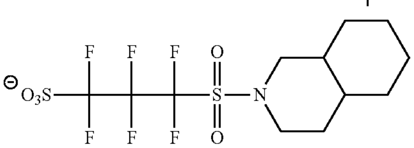
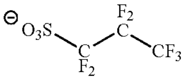

-continued
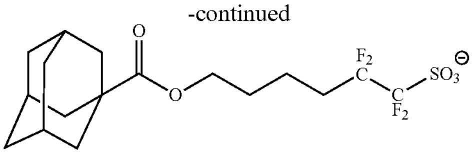
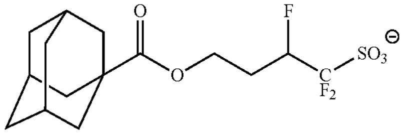
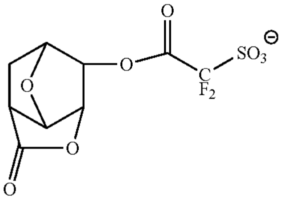
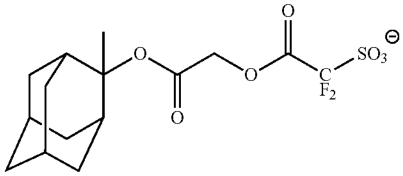
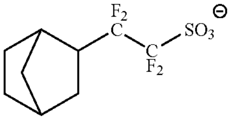
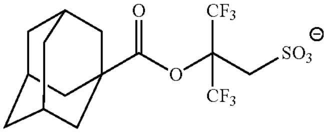
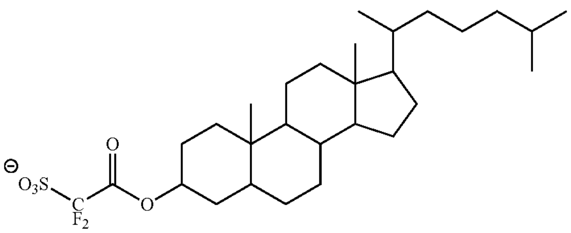
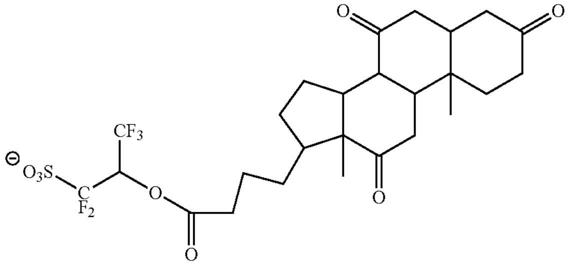
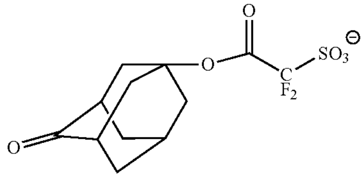
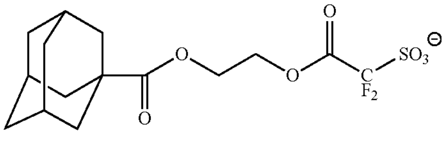
-continued
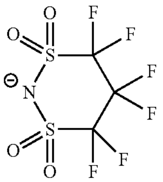
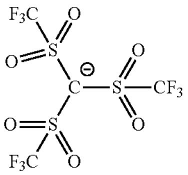
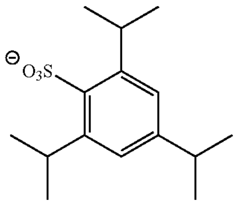
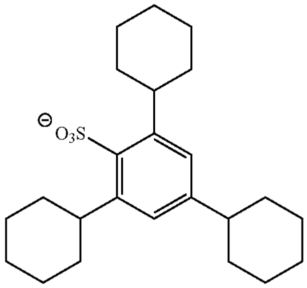
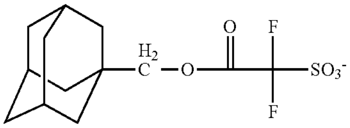
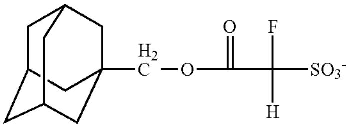
Any combination of the cations and the anions can be used as the photoacid generator.
In addition, the following photoacid generators can also be preferably used. Bu represents a butyl group.
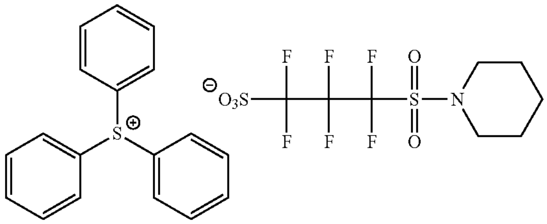
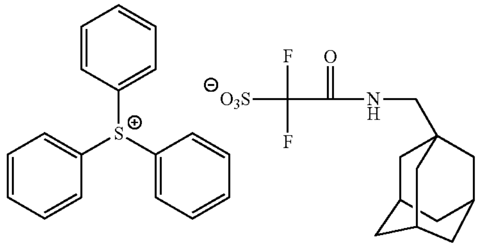
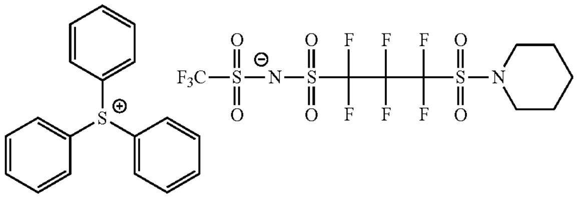

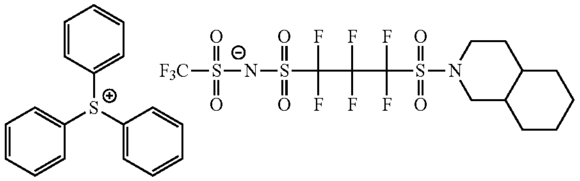
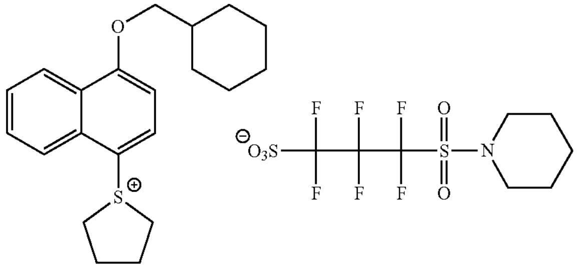
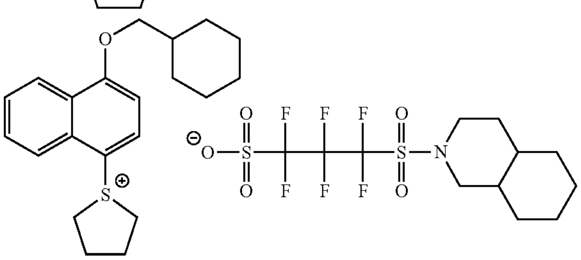
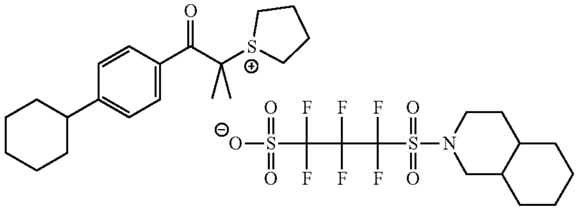
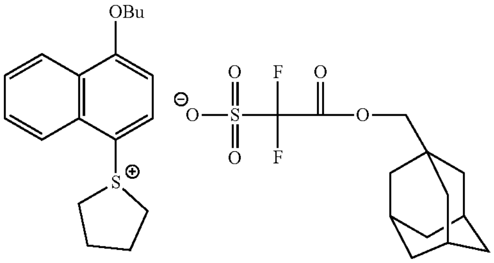
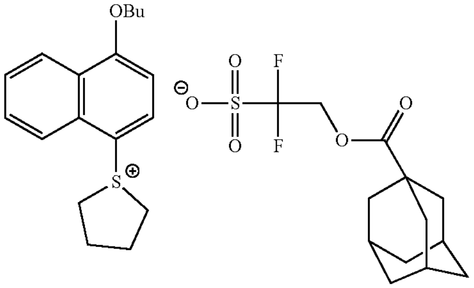
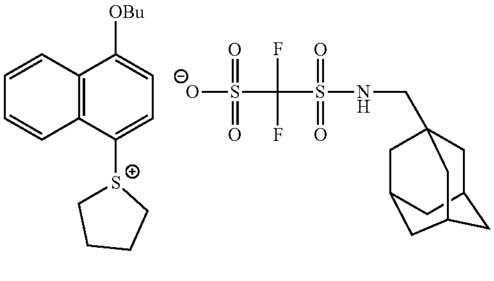
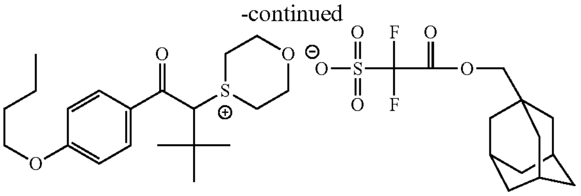
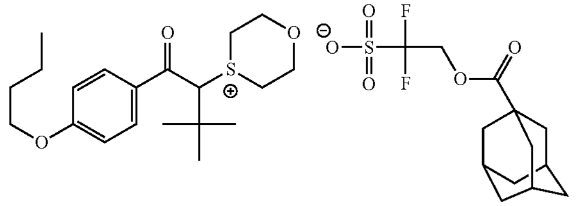
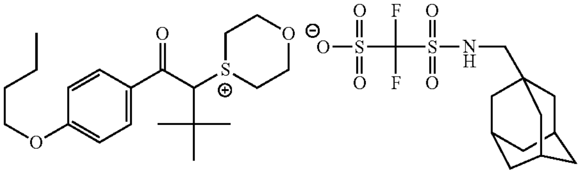
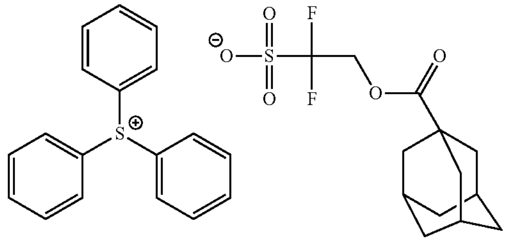
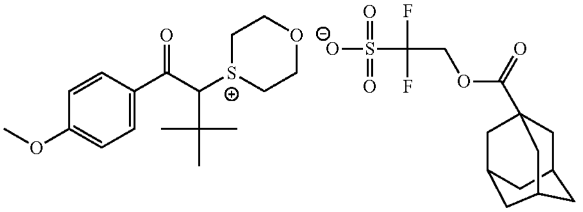
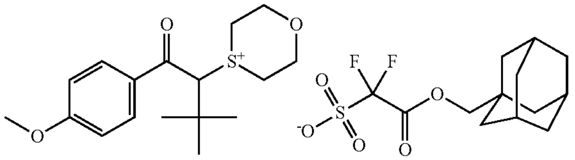
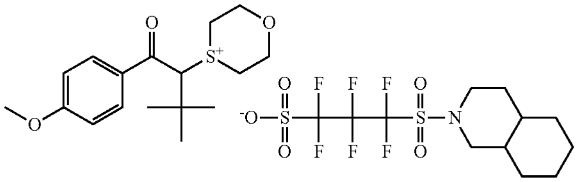
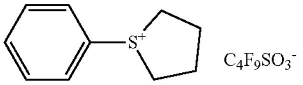
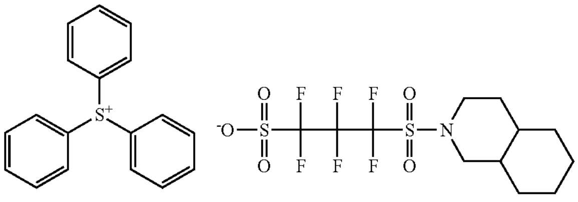
The content of the photoacid generator (P) is not particularly limited, but from the viewpoint that the effect of the present invention is more excellent, the content is preferably 0.1% to 10% by mass, more preferably 0.1% to 5% by mass, and still more preferably 0.1% to 3% by mass with respect to the total solid content of the composition.

The photoacid generators (P) may be used alone or in combination of two or more kinds thereof. In a case where two or more kinds of the photoacid generators (P) are used in combination, the total amount thereof is preferably within the range.

<Acid Diffusion Control Agent (Q)>

The composition of the present invention may contain an acid diffusion control agent (Q).

The acid diffusion control agent (Q) acts as a quencher that suppresses a reaction of an acid-decomposable resin in the unexposed portion by excessive generated acids by trapping the acids generated from a photoacid generator (Q) and the like upon exposure. For example, as the acid diffusion control agent (Q), a basic compound (DA), a basic compound (DB) having basicity reduced or lost upon irradiation with actinic rays or radiation, an onium salt (DC) which serves as a weak acid relative to a photoacid generator (P), a low-molecular-weight compound (DD) having a nitrogen atom and a group that leaves by the action of an acid, an onium salt compound (DE) having a nitrogen atom in a cationic moiety, and the like can be used.

In the composition of the present invention, a known acid diffusion control agent can be appropriately used. For example, the known compounds disclosed in paragraphs [0627 ] to [0664] of US2016/0070167A, paragraphs [0095] to [0187] of US2015/0004544A, paragraphs [0403] to [0423] of US2016/0237190A, and paragraphs [0259] to [0328] of US2016/0274458A can be suitably used as the acid diffusion control agent (Q).

Examples of the basic compound (DA) include the repeating units described in paragraphs 0188 to 0208 of JP2019-045864A.

In the composition of the present invention, the onium salt (DC) which is a relatively weak acid with respect to the photoacid generator (P) can be used as the acid diffusion control agent (Q).

In a case where the photoacid generator (P) and the onium salt generating an acid that is a weak acid relative to an acid generated from the photoacid generator (P) are mixed and used, an acid generated from the photoacid generator (P) upon irradiation with actinic rays or radiation produces an onium salt having a strong acid anion by discharging the weak acid through salt exchange in a case where the acid collides with an onium salt having an unreacted weak acid anion. In this process, the strong acid is exchanged with a weak acid having a lower catalytic ability, and thus, the acid is apparently deactivated and the acid diffusion can be controlled.

Examples of the onium salt which serves as a weak acid relative to the photoacid generator (P) include the onium salts described in paragraphs 0226 to 0233 of JP2019-070676A.

In a case where the composition of the present invention includes an acid diffusion control agent (Q), a content of the acid diffusion control agent (Q) (a total content in a case where a plurality of kinds of the acid diffusion control agents are present) is preferably 0.001% to 1% by mass, and more preferably 0.01% to 0.10% by mass, with respect to the total solid content of the composition.

In the composition of the present invention, the acid diffusion control agents (Q) may be used alone or in combination of two or more kinds thereof.

<Hydrophobic Resin (E)>

The composition of the present invention may contain a hydrophobic resin different from the resin (A) as the hydrophobic resin (E).

Although it is preferable that the hydrophobic resin (E) is designed to be unevenly distributed on a surface of the resist film, it does not necessarily need to have a hydrophilic group in the molecule as different from the surfactant, and does not need to contribute to uniform mixing of polar materials and non-polar materials.

Examples of the effect of addition of the hydrophobic resin (E) include a control of static and dynamic contact angles of a surface of the resist film with respect to water and suppression of out gas.

The hydrophobic resin (E) preferably has any one or more of a "fluorine atom", a "silicon atom", and a "$CH_3$ partial structure which is contained in a side chain moiety of a resin" from the viewpoint of uneven distribution on the film surface layer, and more preferably has two or more kinds thereof. Incidentally, the hydrophobic resin (E) preferably has a hydrocarbon group having 5 or more carbon atoms. These groups may be contained in the main chain of the resin or may be substituted in a side chain.

In a case where hydrophobic resin (E) includes a fluorine atom and/or a silicon atom, the fluorine atom and/or the silicon atom in the hydrophobic resin may be included in the main chain or a side chain of the resin.

In a case where the hydrophobic resin (E) contains a fluorine atom, as a partial structure having a fluorine atom, an alkyl group having a fluorine atom, a cycloalkyl group having a fluorine atom, or an aryl group having a fluorine atom is preferable.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and the alkyl group may further have a substituent other than a fluorine atom.

The cycloalkyl group having a fluorine atom is a monocyclic or polycyclic cycloalkyl group in which at least one hydrogen atom is substituted with a fluorine atom, and may further have a substituent other than a fluorine atom.

Examples of the aryl group having a fluorine atom include an aryl group such as a phenyl group and a naphthyl group, in which at least one hydrogen atom is substituted with a fluorine atom, and the aryl group may further have a substituent other than a fluorine atom.

Examples of the repeating unit having a fluorine atom or a silicon atom include those exemplified in paragraph 0519 of US2012/0251948A.

In addition, as described above, it is also preferable that the hydrophobic resin (E) has a $CH_3$ partial structure in a side chain moiety.

Here, the $CH_3$ partial structure contained in the side chain moiety in the hydrophobic resin includes a $CH_3$ partial structure contained in an ethyl group, a propyl group, and the like.

On the other hand, a methyl group bonded directly to the main chain of the hydrophobic resin (E) (for example, an $\alpha$-methyl group in the repeating unit having a methacrylic acid structure) makes only a small contribution to uneven distribution on the surface of the hydrophobic resin (E) due to the effect of the main chain, and it is therefore not included in the $CH_3$ partial structure in the present invention.

With regard to the hydrophobic resin (E), reference can be made to the description in paragraphs to of JP2014-010245A, the contents of which are incorporated herein by reference.

Furthermore, the resins described in JP2011-248019A, JP2010-175859A, and JP2012-032544A can also be preferably used as the hydrophobic resin (E).

In a case where the composition of the present invention contains the hydrophobic resin (E), a content of the hydrophobic resin (E) is preferably 0.01% to 20% by mass, and more preferably 0.1% to 15% by mass with respect to the total solid content of the composition.

<Solvent (F)>

A solvent (also referred to as a "solvent (F)") will be described.

The solvent (F) preferably contains at least one solvent of (M1) propylene glycol monoalkyl ether carboxylate, or (M2) at least one selected from the group consisting of a propylene glycol monoalkyl ether, a lactic acid ester, an acetic acid ester, an alkoxypropionic acid ester, a chain ketone, a cyclic ketone, a lactone, and an alkylene carbonate as a solvent. The solvent in this case may further contain components other than the components (M1) and (M2).

The solvent containing the components (M1) and (M2) is preferable since a use of the solvent in combination with the above-mentioned resin (A) makes it possible to form a pattern having a small number of development defects can be formed while improving the coating property of the composition.

In addition, examples of the solvent (F) include organic solvents such as alkylene glycol monoalkyl ether carboxylate, alkylene glycol monoalkyl ether, alkyl lactate ester, alkyl alkoxypropionate, a cyclic lactone (preferably having 4 to 10 carbon atoms), a monoketone compound (preferably having 4 to 10 carbon atoms) which may contain a ring, alkylene carbonate, alkyl alkoxyacetate, and alkyl pyruvate.

The content of the solvent (F) in the composition of the present invention is preferably adjusted so that the concentration of solid contents of the composition is 0.5% to 50% by mass, and more preferably adjusted so that the concentration of solid contents of the composition is 3% to 45% by mass.

Among those, the concentration of solid contents is preferably 20% by mass or more from the viewpoint that the effect of the present invention is more excellent.

Therefore, the addition amount of the solvent (F) to be put into the stirring tank in the step 1 is adjusted so that the concentration of solid contents of the actinic ray-sensitive or radiation-sensitive resin composition produced by the production method of the embodiment of the present invention is preferably within the range. Furthermore, the concentration of solid contents means a mass percentage of the mass of other components (components which can constitute an actinic ray-sensitive or radiation-sensitive film) excluding the solvent with respect to the total mass of the actinic ray-sensitive or radiation-sensitive resin composition.

<Surfactant (H)>

The composition of the present invention may contain a surfactant (H). By incorporation of the surfactant (H), it is possible to form a pattern having more excellent adhesiveness and fewer development defects.

As the surfactant (H), fluorine-based and/or silicon-based surfactants are preferable.

Examples of the fluorine-based and/or silicon-based surfactant include the surfactants described in paragraph of the specification of US2008/0248425A. In addition, EFTOP EF301 or EF303 (manufactured by Shin-Akita Chemical Co., Ltd.); FLUORAD FC430, 431, or 4430 (manufactured by Sumitomo 3M Inc.); MEGAFACE F171, F173, F176, F189, F113, F110, F177, F120, or $R_{08}$ (manufactured by DIC Corporation); SURFLON S-382, SC101, 102, 103, 104, 105, or 106 (manufactured by Asahi Glass Co., Ltd.); TROYSOL S-366 (manufactured by Troy Corporation); GF-300 or GF-150 (manufactured by Toagosei Co., Ltd.); SURFLON S-393 (manufactured by AGC Seimi Chemical Co., Ltd.); EFTOP EF121, EF122A, EF122B, RF122C, EF125M, EF135M, EF351, EF352, EF801, EF802, or EF601 (manufactured by JEMCO Inc.); PF636, PF656, PF6320, or PF6520 (manufactured by OMNOVA Solutions Inc.); KH-20 (manufactured by Asahi Kasei Corporation); or FTX-204G, 208G, 218G, 230G, 204D, 208D, 212D, 218D, or 222D (manufactured by NEOS Co., Ltd.) may be used. In addition, Polysiloxane Polymer KP-341 (manufactured by Shin-Etsu Chemical Co., Ltd.), can also be used as the silicon-based surfactant.

Moreover, the surfactant (H) may be synthesized using a fluoroaliphatic compound manufactured using a telomerization method (also referred to as a telomer method) or an oligomerization method (also referred to as an oligomer method), in addition to the known surfactants as shown above. Specifically, a polymer including a fluoroaliphatic group derived from fluoroaliphatic compound may be used as the surfactant (H). This fluoroaliphatic compound can be synthesized, for example, by the method described in JP2002-90991A.

As the polymer having a fluoroaliphatic group, a copolymer of a monomer having a fluoroaliphatic group and (poly(oxyalkylene)) acrylate and/or (poly(oxyalkylene)) methacrylate is preferable, and the polymer may be unevenly distributed or block-copolymerized. Furthermore, examples of the poly(oxyalkylene) group include a poly (oxyethylene) group, a poly(oxypropylene) group, and a poly(oxybutylene) group, and the group may also be a unit such as those having alkylenes having different chain lengths within the same chain length such as poly(block-linked oxyethylene, oxypropylene, and oxyethylene) and poly(block-linked oxyethylene and oxypropylene). In addition, the copolymer of a monomer having a fluoroaliphatic group and (poly(oxyalkylene)) acrylate (or methacrylate) is not limited only to a binary copolymer but may also be a ternary or higher copolymer obtained by simultaneously copolymerizing monomers having two or more different fluoroaliphatic groups or two or more different (poly(oxyalkylene)) acrylates (or methacrylates).

Examples of a commercially available surfactant thereof include MEGAFACE F-178, F-470, F-473, F-475, F-476, and F-472 (manufactured by DIC Corporation), a copolymer of acrylate (or methacrylate) having a $C_6F_{13}$ group and (poly(oxyalkylene)) acrylate (or methacrylate), and a copolymer of acrylate (or methacrylate) having a $C_3F_7$ group, (poly(oxyethylene)) acrylate (or methacrylate), and (poly (oxypropylene)) acrylate (or methacrylate).

In addition, a surfactant other than the fluorine-based surfactant and/or the silicon-based surfactants described in paragraph of US2008/0248425A may be used.

These surfactants (H) may be used alone or in combination of two or more kinds thereof.

The content of the surfactant (H) is preferably 0.0001% to 2% by mass and more preferably 0.0005% to 1% by mass with respect to the total solid content of the composition.

<Other Additives>

The composition of the present invention may further contain a crosslinking agent, an alkali-soluble resin, a dissolution inhibiting compound, a dye, a plasticizer, a photosensitizer, a light absorber, and/or a compound that accelerates solubility in a developer.

[Pattern Forming Method]

The actinic ray-sensitive or radiation-sensitive resin composition produced by the above-mentioned production method of the embodiment of the present invention can be used, for example, for pattern formation in a process for manufacturing a semiconductor device, and the like.

The actinic ray-sensitive or radiation-sensitive resin composition produced by the production method of the embodiment of the present invention is typically a resist composition (preferably a chemically amplified resist composition), and may be either even a positive tone resist composition or a negative tone resist composition. In addition, the actinic ray-sensitive or radiation-sensitive resin composition produced by the production method of the embodiment of the present invention may be a resist composition for alkali development or a resist composition for organic solvent development.

The pattern forming method using the actinic ray-sensitive or radiation-sensitive resin composition produced by the production method of the embodiment of the present invention is not particularly limited, but preferably has the following steps.

Step A: a step of forming a resist film on a substrate using the actinic ray-sensitive or radiation-sensitive resin composition produced by the production method of the embodiment of the present invention Step B: a step of exposing the resist film Step C: a step of developing the exposed resist film using a developer to form a pattern Hereinafter, each of the steps will be described in detail.

(Step A: Resist Film Forming Step)

The step A is a step of forming a resist film on a substrate using the actinic ray-sensitive or radiation-sensitive resin composition produced by the production method of the embodiment of the present invention.

The production method of the embodiment of the present invention and the composition of the present invention are as described above.

Examples of a method for forming a resist film on a substrate using the actinic ray-sensitive or radiation-sensitive resin composition produced by the production method of the embodiment of the present invention include a method of applying the composition onto the substrate.

In addition, it is preferable that the composition before the application is filtered through a filter, as necessary. A pore size of the filter is preferably 0.1 μm or less, more preferably 0.05 μm or less, and still more preferably 0.03 μm or less. In addition, the filter is preferably a polytetrafluoroethylene-, polyethylene-, or nylon-made filter.

The composition can be applied onto a substrate (for example, silicon and silicon dioxide coating) as used in the manufacture of integrated circuit elements by a suitable application method such as ones using a spinner or a coater. As the application method, spin application using a spinner is preferable.

After applying the composition, the substrate may be dried to form a resist film. Furthermore, various underlying films (an inorganic film, an organic film, or an antireflection film) may be formed on the underlayer of the resist film, as necessary.

Examples of the drying method include a heating method (prebaking: PB). The heating may be performed using a unit included in an ordinary exposure machine and/or an ordinary development machine, and may also be performed using a hot plate or the like.

The heating temperature is preferably 80° C. to 150° C., and more preferably 80° C. to 140° C.

The heating time is preferably 30 to 1,000 seconds, and more preferably 40 to 800 seconds.

A film thickness of the resist film is not particularly limited, but in a case of a resist film for KrF exposure, the film thickness is preferably 3 to 20 μm, and more preferably 5 to 18 μm.

In addition, in a case of a resist film for ArF exposure or EUV exposure, the film thickness is preferably 30 to 700 nm, and more preferably 40 to 400 nm.

Moreover, a topcoat may be formed on the upper layer of the resist film, using the topcoat composition.

It is preferable that the topcoat composition is not mixed with the resist film and can be uniformly applied onto the upper layer of the resist film.

The film thickness of the topcoat is preferably 10 to 200 nm, and more preferably 20 to 100 nm.

The topcoat is not particularly limited, a topcoat known in the related art can be formed by a method known in the related art, and for example, the topcoat can be formed in accordance with the description in paragraphs 0072 to 0082 of JP2014-059543A.

(Step B: Exposing Step)

The step B is a step of exposing the resist film.

Examples of the exposing method include a method of irradiating the resist film formed with actinic rays or radiation through a predetermined mask.

Examples of the actinic rays or the radiation include infrared light, visible light, ultraviolet light, far ultraviolet light, extreme ultraviolet light, X-rays, and electron beams (EB), preferably a far ultraviolet light having a wavelength of 250 nm or less, more preferably a far ultraviolet light having a wavelength of 220 nm or less, and still more preferably a far ultraviolet light having a wavelength of 1 to 200 nm, specifically, KrF excimer laser (248 nm), ArF excimer laser (193 nm), $F_2$ excimer laser (157 nm), EUV (13 nm), X-rays, and EB.

It is preferable to perform baking (post-exposure bake: PEB) after exposure and before development.

The heating temperature is preferably 80° C. to 150° C., and more preferably 80° C. to 140° C.

The heating time is preferably 10 to 1,000 seconds, and more preferably 10 to 180 seconds.

The heating may be performed using a unit included in an ordinary exposure machine and/or an ordinary development machine, and may also be performed using a hot plate or the like.

This step is also described as a post-exposure baking.

(Step C: Developing Step)

The step C is a step of developing the exposed resist film using a developer to form a pattern.

Examples of the developing method include a method in which a substrate is immersed in a tank filled with a developer for a certain period of time (a dip method), a method in which development is performed by heaping a developer up onto the surface of a substrate by surface tension, and then leaving it to stand for a certain period of time (a puddle method), a method in which a developer is sprayed on the surface of a substrate (a spray method), and a method in which a developer is continuously jetted onto a substrate rotating at a constant rate while scanning a developer jetting nozzle at a constant rate (a dynamic dispense method).

In addition, after the step of performing development, a step of stopping the development may be carried out while substituting the solvent with another solvent.

A developing time is not particularly limited as long as it is a period of time where the unexposed portion of a resin is sufficiently dissolved, and is preferably 10 to 300 seconds, and more preferably 20 to 120 seconds.

The temperature of the developer is preferably 0° C. to 50° C., and more preferably 15° C. to 35° C.

Examples of the developer include an alkali developer and an organic solvent developer.

As the alkali developer, it is preferable to use an aqueous alkali solution containing an alkali. Among those, the aqueous solutions of the quaternary ammonium salts typified by tetramethylammonium hydroxide (TMAH) are preferable as the alkali developer. An appropriate amount of an alcohol, a surfactant, or the like may be added to the alkali developer. The alkali concentration of the alkali developer is usually 0.1% to 20% by mass. Furthermore, the pH of the alkali developer is usually 10.0 to 15.0.

The organic solvent developer (also referred to as an organic developer) is a developer containing an organic solvent.

Examples of the organic solvent used in the organic solvent developer include known organic solvents, and include an ester-based solvent, a ketone-based solvent, an alcohol-based solvent, an amide-based solvent, an ether-based solvent, and a hydrocarbon-based solvent.

(Other Steps)

It is preferable that the pattern forming method includes a step of performing cleaning using a rinsing liquid after the step C.

Examples of the rinsing liquid used in the rinsing step after the step of performing development using an alkali developer include pure water. Furthermore, an appropriate amount of a surfactant may be added to pure water.

An appropriate amount of a surfactant may be added to the rinsing liquid.

The rinsing liquid used in the rinsing step after the developing step with an organic developer is not particularly limited as long as the rinsing liquid does not dissolve a resist pattern, and a solution including a common organic solvent can be used. As the rinsing liquid, a rinsing liquid containing at least one organic solvent selected from the group consisting of a hydrocarbon-based solvent, a ketone-based solvent, an ester-based solvent, an alcohol-based solvent, an amide-based solvent, and an ether-based solvent is preferably used. Furthermore, an appropriate amount of a surfactant may be added to the rinsing liquid.

In addition, an etching treatment on the substrate may be carried out using a pattern thus formed as a mask. That is, the substrate (or the underlayer film and the substrate) may be processed using the pattern thus formed in the step C as a mask to form a pattern on the substrate.

A method for processing the substrate (or the underlayer film and the substrate) is not particularly limited, but a method in which a pattern is formed on a substrate by subjecting the substrate (or the underlayer film and the substrate) to dry etching using the pattern thus formed in the step C as a mask is preferable.

The dry etching may be one-stage etching or multi-stage etching. In a case where the etching is etching including a plurality of stages, the etchings at the respective stages may be the same treatment or different treatments.

For etching, any of known methods can be used, and various conditions and the like are appropriately determined according to the type of a substrate, usage, and the like. Etching can be carried out, for example, in accordance with Journal of The International Society for Optical Engineering (Proc. of SPIE), Vol. 6924, 692420 (2008), JP2009-267112A, and the like. In addition, the etching can also be carried out in accordance with the method described in "Chapter 4 Etching" in "Semiconductor Process Text Book, 4th Ed., published in 2007, publisher: SEMI Japan".

Among those, oxygen plasma etching is preferable as the dry etching.

It is preferable that various materials (for example, a solvent, a developer, a rinsing liquid, a composition for forming an antireflection film, and a composition for forming a topcoat) used in the production method of the embodiment of the present invention and the composition of the present invention do not contain impurities such as metals. The content of the impurities included in these materials is preferably 1 ppm by mass or less, more preferably 10 ppb by mass or less, still more preferably 100 ppt by mass or less, particularly preferably 10 ppt by mass or less, and most preferably 1 ppt by mass or less. Here, examples of the metal impurities include Na, K, Ca, Fe, Cu, Mg, Al, Li, Cr, Ni, Sn, Ag, As, Au, Ba, Cd, Co, Mo, Zr, Pb, Ti, V, W, and Zn.

Examples of a method for removing impurities such as metals from the various materials include filtration using a filter. A pore diameter of the filter is preferably 0.20 μm or less, more preferably 0.05 μm or less, and still more preferably 0.01 μm or less.

As a material of the filter, a fluororesin such as polytetrafluoroethylene (PTFE) and perfluoroalkoxy alkane (PFA), a polyolefin resin such as polypropylene and polyethylene, and a polyamide resin such as nylon 6 and nylon 66 are preferable. As the filter, a filter which has been cleaned with an organic solvent in advance may be used. In the step of filtration using a filter, a plurality of filters or a plurality of kinds of filters connected in series or in parallel may be used. In a case of using the plurality of kinds of filters, a combination of filters having different pore diameters and/or materials may be used. In addition, various materials may be filtered plural times, and the step of filtering plural times may be a circulation-filtration step. As the circulation-filtration step, for example, the method disclosed in JP2002-62667A is preferable.

As the filter, a filter having a reduced amount of elutes as disclosed in JP2016-201426A is preferable.

In addition to the filtration using a filter, removal of impurities by an adsorbing material may be performed, or a combination of filtration using a filter and an adsorbing material may be used. As the adsorbing material, known adsorbing materials can be used, and for example, inorganic adsorbing materials such as silica gel and zeolite, or organic adsorbing materials such as activated carbon can be used. Examples of the metal adsorbing material include those disclosed in JP2016-206500A.

In addition, examples of a method for reducing the impurities such as metals included in various materials include a method in which a raw material having a low metal content is selected as a raw material constituting various materials and the raw material constituting the various materials is subjected to filtration using a filter; and a method in which distillation and the like are performed under conditions suppressing contamination as much as possible by performing a lining or coating with a fluororesin and the like in the inside of a device. Preferred conditions for the filtration using a filter performed on the raw materials constituting various materials are the same ones as the above-mentioned conditions.

In order to prevent impurities from being incorporated, it is preferable that various materials are stored in the container described in the specification of US2015/0227049A, JP2015-123351A, JP2017-13804A, or the like.

Various materials may be used after being diluted with the solvent used in the composition.

Moreover, the present invention further relates to a method for manufacturing an electronic device, including the pattern forming method, and an electronic device manufactured by the manufacturing method.

The electronic device of an embodiment of the present invention is suitably mounted on electric and electronic equipment (for example, home appliances, office automation (OA)-related equipment, media-related equipment, optical equipment, telecommunication equipment, and the like).

EXAMPLES

Hereinbelow, the present invention will be described in more detail with reference to Examples. The materials, the amounts of materials used, the proportions, the treatment details, the treatment procedure, and the like shown in Examples below may be modified as appropriate as long as the modifications do not depart from the spirit of the present invention. Therefore, the scope of the present invention should not be construed as being limited to Examples shown below.

<Synthesis of Resin (A)>

In Examples and Comparative Examples, the following resin was used as the resin (A). As the following resins, those synthesized based on known techniques were used.

The compositional ratio (molar ratio; corresponding in order from the left), the weight-average molecular weight (Mw), and the dispersity (Mw/Mn) of each repeating unit in the resin (A) are shown in Table 1.

Furthermore, the weight-average molecular weight (Mw) and the dispersity (Mw/Mn) of the resins were values expressed in terms of polystyrene, measured by the above-mentioned GPC method (carrier: tetrahydrofuran (THF)). In addition, the compositional ratio (ratio based on % by mole) of the repeating unit in the resin was measured by $^{13}$C-nuclear magnetic resonance (NMR).

TABLE 1

| Resin | Molar ratio of repeating unit | | | Mw | Mw/Mn |
|---|---|---|---|---|---|
| Polymer A | 63 | 18 | 19 | 20,000 | 1.5 |
| Polymer B | 60 | 30 | 10 | 30,000 | 1.8 |
| Polymer C | 60 | 30 | 10 | 25,000 | 1.5 |
| Polymer D | 65 | 25 | 10 | 23,000 | 1.6 |

Polymer A

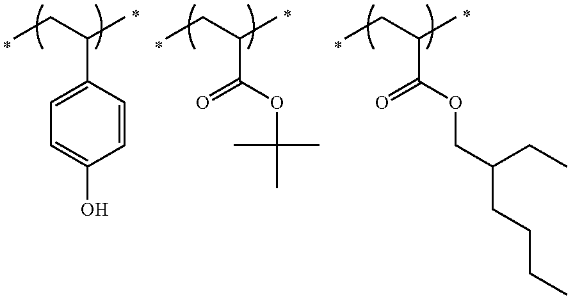

-continued

Polymer B

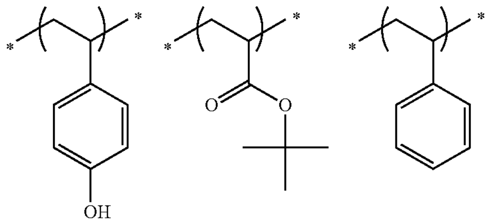

Polymer C

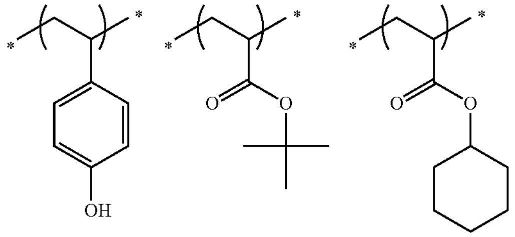

Polymer D

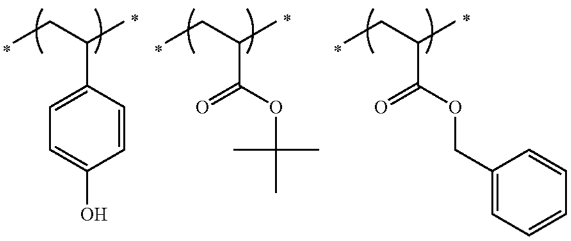

<Photoacid Generator>

The structures of the compounds used as the photoacid generator in Examples and Comparative Examples are shown below.

PAG-A

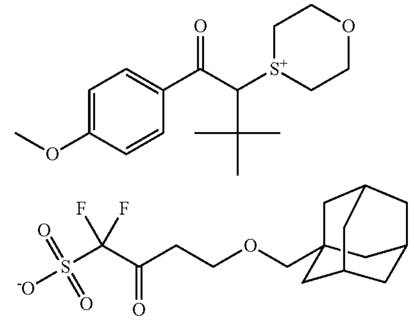

PAG-B

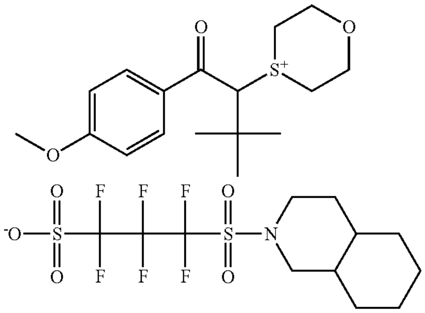

-continued

PAG-C

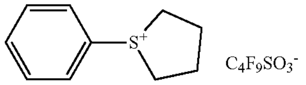

PAG-D

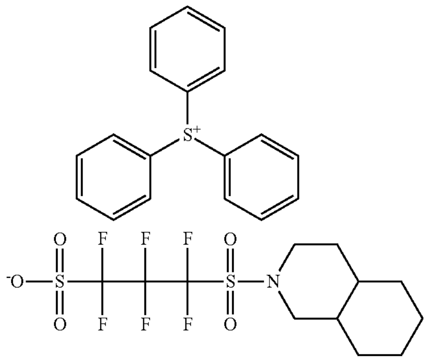

<Acid Diffusion Control Agent (Q)>

The structures of compounds used as the acid diffusion control agent in Examples and Comparative Examples are shown below.

Q-1

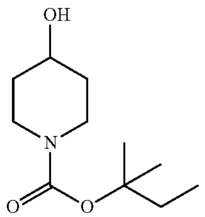

Q-2

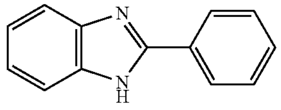

Q-3

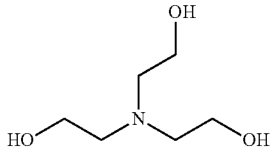

<Solvent>

Solvents used in Examples and Comparative Examples are shown below.

PGMEA: Propylene glycol monomethyl ether acetate

PGME: Propylene glycol monomethyl ether

EL: Ethyl lactate

<Surfactant (H)>

Surfactants used in Examples and Comparative Examples are shown below.

W-A: MEGAFACE R-41 (manufactured by DIC Corporation)

<Additive (X)>

Additives used in Examples and Comparative Examples are shown below.

Additive-A

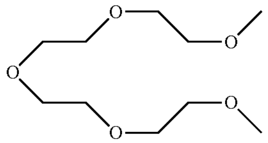

Additive-B

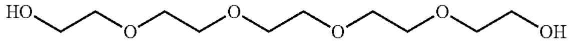

Additive-C

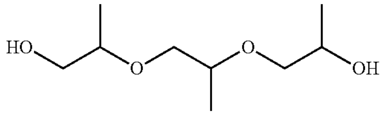

Examples 1 to 21 and Comparative Examples 1 and 2

<Production of Actinic Ray-Sensitive or Radiation-Sensitive Resin Composition>

Based on the production device 100 shown in the FIGURE, a resist composition was produced as follows.

(Step 1)

Each component was charged into a stirring tank (capacity of 200 L) disposed in a clean room (Class 5 according to International Organization for Standardization, ISO 14644-1, room temperature (23° C.), atmospheric pressure (101, 325 Pa)) (corresponding to the stirring tank 10 in the FIGURE) so as to have the composition of the resist composition shown in Table 2.

A void ratio (proportion occupied by a space (void)) in the stirring tank after putting each component was 20% by volume. In other words, an occupancy of the mixture in the stirring tank was 80% by volume. Furthermore, in the step 1, the stirring shaft (corresponding to the stirring shaft 12 in the FIGURE) is not rotating.

(Step 2)

Next, the stirring shaft (corresponding to the stirring shaft 12 in the FIGURE), which was provided in the stirring tank and to which a stirring blade (corresponding to the stirring tank 14 in the FIGURE) was attached, was rotated at a stirring rotation speed shown in Table 2, and the respective components were stirred and mixed to carry out the step 2.

At the same time as the start of stirring, in Examples 1 to 21 and Comparative Example 1, at a temperature for passing components through the stirring tank shown in Table 2, a nitrogen gas adjusted by a temperature control device (corresponding to the temperature control device 24 in the FIGURE) was introduced into the stirring tank. The liquid temperature (initial stirring temperature) at the start of the step 2 is as shown in Table 2. In Comparative Example 2, an atmosphere adjusted to a temperature for passing through the stirring tank shown in Table 2 was introduced into the stirring tank.

In Examples 1 to 20 and Comparative Example 1, a first-stage flow rates of the nitrogen gas shown in Table 2 were each set and the nitrogen gas was introduced into the stirring tank. The temperature in the stirring tank was confirmed, and at a time of the temperature reaching the upper limit width of the temperature shown in Table 2, the liquid temperature was lowered by changing the flow rate of the nitrogen gas to a second-stage flow rate.

By confirming that the liquid temperature was decreased to the initial temperature shown in Table 2, the flow rate of the nitrogen gas was changed to the first-stage flow rate again. The time required for the decrease to the initial temperature at this time is shown in Table 2.

In this manner, the first-stage flow rate and the second-stage flow rate were repeated, and the stirring was completed at a lapse of 8 hours from the start of the stirring.

While the step 2 was carried out, the introduction of the nitrogen gas adjusted to the temperature for passing through the stirring tank was continued.

In Example 21, the first-stage flow rate of the nitrogen gas shown in Table 2 was set to introduce the nitrogen gas into the stirring tank, and the stirring was completed at a lapse of 8 hours from the start of stirring without changing the flow rate.

With regard to Example 21, the upper limit width of the temperature shown in Table 2 indicates a value in which the temperature is most increased from the initial stirring temperature during the stirring time.

The measurement of the liquid temperature in the stirring tank throughout the entire step 2 was performed using a temperature sensor (corresponding to the temperature sensor 20 in the FIGURE) (manufactured by Hayashi Denko Co., Ltd., a digital temperature sensor).

The measurement and the adjustment of the flow rates of the nitrogen gas and the atmosphere throughout the entire step 2 were performed by a flow rate control device (corresponding to the flow rate control device 26 in the FIGURE) (manufactured by KEYENCE Corporation, a flow rate sensor for an amplifier-separated gas).

After the stirring was completed, the mixture (solution) obtained through the step 2 was passed through a polyethylene filter having a pore diameter of 3 μm to produce an actinic ray-sensitive or radiation-sensitive resin composition (resist composition).

The viscosity of the resist composition is shown in Table 2.

The viscosity of the produced resist composition is 10 mPa·s or more. The viscosity is a value measured by a viscometer (RE-85L) manufactured by TOKISANGYO Co., Ltd. at 25.0° C.

In Table 2, the "Content" column of each component shows a content (% by mass) of each component with respect to the total solid content in the resist composition.

In Table 2, the numerical value in the "Solvent" column indicates a mass ratio of each solvent.

The total concentration (% by mass) of solid contents in the resist composition was the value shown in Table 2.

TABLE 2

| | Resist composition | Concentration of solid contents (%) | Composition: Resin (A) Type | Resin (A) Content (% by mass) | Photoacid generator PAG | Photoacid generator Content (% by mass) | Acid diffusion control agent Type | Acid diffusion control agent Content (% by mass) |
|---|---|---|---|---|---|---|---|---|
| Example 1 | 1 | 40.0 | Polymer A | 88.690 | PAG-A | 1.2 | Q-1 | 0.025 |
| Example 2 | 2 | 40.0 | Polymer A | 89.674 | PAG-B | 1.2 | Q-1 | 0.026 |
| Example 3 | 3 | 40.0 | Polymer A | 88.685 | PAG-A | 1.2 | Q-1 | 0.025 |
| Example 4 | 4 | 40.0 | Polymer A | 88.476 | PAG-A | 1.4 | Q-1 | 0.024 |
| Example 5 | 5 | 40.0 | Polymer A | 88.790 | PAG-A | 1.1 | Q-1 | 0.025 |
| Example 6 | 6 | 40.0 | Polymer A | 88.689 | PAG-A | 1.2 | Q-2 | 0.026 |
| Example 7 | 7 | 40.0 | Polymer A | 88.687 | PAG-A | 1.2 | Q-3 | 0.028 |
| Example 8 | 8 | 40.0 | Polymer A | 88.690 | PAG-A | 1.2 | Q-1 | 0.025 |
| Example 9 | 9 | 40.0 | Polymer A | 88.690 | PAG-A | 1.2 | Q-1 | 0.025 |
| Example 10 | 10 | 41.5 | Polymer B | 88.790 | PAG-B | 1.1 | Q-1 | 0.025 |
| Example 11 | 11 | 41.7 | Polymer C | 88.490 | PAG-A | 1.4 | Q-1 | 0.025 |
| Example 12 | 12 | 41.0 | Polymer A | 88.790 | PAG-A | 1.1 | Q-1 | 0.025 |
| Example 13 | 13 | 39.0 | Polymer A | 88.790 | PAG-A | 1.1 | Q-1 | 0.025 |
| Example 14 | 14 | 41.5 | Polymer A | 88.790 | PAG-A | 1.1 | Q-1 | 0.025 |
| Example 15 | 15 | 42.0 | Polymer A | 88.790 | PAG-A | 1.1 | Q-1 | 0.025 |
| Example 16 | 16 | 44.0 | Polymer A | 88.790 | PAG-D | 1.1 | Q-1 | 0.025 |
| Example 17 | 17 | 48.0 | Polymer C | 88.790 | PAG-A | 1.1 | Q-1 | 0.025 |
| Example 18 | 18 | 25.0 | Polymer A | 98.455 | PAG-A | 1.4 | Q-1 | 0.060 |
| Example 19 | 19 | 40.0 | Polymer A | 88.690 | PAG-A | 1.2 | Q-1 | 0.025 |
| Example 20 | 20 | 40.0 | Polymer A | 88.690 | PAG-A | 1.2 | Q-1 | 0.025 |
| Example 21 | 21 | 40.0 | Polymer A | 88.690 | PAG-A | 1.2 | Q-1 | 0.025 |
| Comparative Example 1 | C1 | 48.0 | Polymer A | 88.690 | PAG-C | 1.2 | Q-1 | 0.025 |
| Comparative Example 2 | C2 | 40.0 | Polymer A | 88.690 | PAG-A | 1.2 | Q-1 | 0.025 |

| | Composition: Surfactant Type | Surfactant Content (% by mass) | Additive Type | Additive Content (% by mass) | Solvent 1 | Solvent 2 | Mass ratio (solvent 1/solvent 2) |
|---|---|---|---|---|---|---|---|
| Example 1 | W-A | 0.085 | Additive-A | 10 | PGMEA | PGME | 50/50 |
| Example 2 | W-A | 0.100 | Additive-A | 9 | PGMEA | PGME | 50/50 |
| Example 3 | W-A | 0.090 | Additive-A | 10 | PGMEA | PGME | 50/50 |
| Example 4 | W-A | 0.100 | Additive-A | 10 | PGMEA | PGME | 50/50 |
| Example 5 | W-A | 0.085 | Additive-A | 10 | PGMEA | PGME | 50/50 |

TABLE 2-continued

| | | | | | | | |
|---|---|---|---|---|---|---|---|
| Example 6 | W-A | 0.085 | Additive-A | 10 | PGMEA | PGME | 50/50 |
| Example 7 | W-A | 0.085 | Additive-A | 10 | PGMEA | PGME | 50/50 |
| Example 8 | W-A | 0.085 | Additive-B | 10 | PGMEA | PGME | 50/50 |
| Example 9 | W-A | 0.085 | Additive-C | 10 | PGMEA | PGME | 50/50 |
| Example 10 | W-A | 0.085 | Additive-A | 10 | PGMEA | PGME | 50/50 |
| Example 11 | W-A | 0.085 | Additive-A | 10 | PGMEA | PGME | 50/50 |
| Example 12 | W-A | 0.085 | Additive-A | 10 | PGMEA | PGME | 80/20 |
| Example 13 | W-A | 0.085 | Additive-A | 10 | PGMEA | PGME | 40/60 |
| Example 14 | W-A | 0.085 | Additive-A | 10 | PGMEA | EL | 80/20 |
| Example 15 | W-A | 0.085 | Additive-A | 10 | PGMEA | PGME | 50/50 |
| Example 16 | W-A | 0.085 | Additive-A | 10 | PGMEA | PGME | 50/50 |
| Example 17 | W-A | 0.085 | Additive-A | 10 | PGMEA | PGME | 50/50 |
| Example 18 | W-A | 0.085 | Additive-A | 0 | PGMEA | PGME | 50/50 |
| Example 19 | W-A | 0.085 | Additive-A | 10 | PGMEA | PGME | 50/50 |
| Example 20 | W-A | 0.085 | Additive-A | 10 | PGMEA | PGME | 50/50 |
| Example 21 | W-A | 0.085 | Additive-A | 10 | PGMEA | PGME | 50/50 |
| Comparative Example 1 | W-A | 0.085 | Additive-A | 10 | PGMEA | PGME | 50/50 |
| Comparative Example 2 | W-A | 0.085 | Additive-A | 10 | PGMEA | PGME | 50/50 |

| | Conditions for passage of nitrogen gas | | | Stirring conditions | | | |
|---|---|---|---|---|---|---|---|
| | First-stage follow rate (L/min) | Second-stage follow rate (L/min) | Temperature of nitrogen gas for passing components through the stirring tank (° C.) | Initial stirring temperature (° C.) | Temperature upper limit width (° C.) | Time taken until decrease to initial temperature (hours) | Rotation speed of stirring (rpm) |
| Example 1 | 3 | 12 | 18 | 22.4 | 2.0 | 1.0 | 250 |
| Example 2 | 3 | 9 | 18 | 22.5 | 2.0 | 1.5 | 250 |
| Example 3 | 3 | 6 | 18 | 22.1 | 2.0 | 1.8 | 250 |
| Example 4 | 3 | 12 | 25 | 22.0 | 2.0 | 4.0 | 250 |
| Example 5 | 3 | 12 | 18 | 22.3 | 2.0 | 4.0 | 450 |
| Example 6 | 3 | 12 | 18 | 22.4 | 2.0 | 1.0 | 250 |
| Example 7 | 3 | 12 | 18 | 22.4 | 2.0 | 1.0 | 250 |
| Example 8 | 3 | 12 | 18 | 22.4 | 2.0 | 1.0 | 250 |
| Example 9 | 3 | 12 | 18 | 22.4 | 2.0 | 1.0 | 250 |
| Example 10 | 3 | 12 | 18 | 24.0 | 2.0 | 1.0 | 250 |
| Example 11 | 3 | 12 | 18 | 24.0 | 2.0 | 1.0 | 250 |
| Example 12 | 3 | 12 | 18 | 22.4 | 2.0 | 1.0 | 250 |
| Example 13 | 3 | 12 | 18 | 22.4 | 2.0 | 1.0 | 250 |
| Example 14 | 3 | 12 | 18 | 22.4 | 2.0 | 1.0 | 250 |
| Example 15 | 3 | 12 | 18 | 22.5 | 2.0 | 4.0 | 250 |
| Example 16 | 3 | 12 | 18 | 22.5 | 2.0 | 4.0 | 250 |
| Example 17 | 3 | 12 | 18 | 22.2 | 2.0 | 4.0 | 250 |
| Example 18 | 3 | 12 | 18 | 22.5 | 1.0 | 1.0 | 200 |
| Example 19 | 3 | 12 | 18 | 23.5 | 2.5 | 4.0 | 250 |
| Example 20 | 3 | 12 | 18 | 22.4 | 2.0 | 4.0 | 350 |
| Example 21 | 9 | — | 18 | 22.0 | 2.0 | — | 250 |
| Comparative Example 1 | — | — | — | 22.7 | 7.0 | — | 250 |
| Comparative Example 2 | 3 (passage of atmosphere) | 12 (passage of atmosphere) | 18 | 22.4 | 2.0 | 2.0 | 250 |

| | Measurement data | | |
|---|---|---|---|
| | Film thickness (μm) | In-plane uniformity 3σ (nm) | Viscosity (mPa · s) |
| Example 1 | 12.0 | 42 | 346 |
| Example 2 | 12.2 | 46 | 350 |
| Example 3 | 12.3 | 50 | 355 |
| Example 4 | 12.9 | 90 | 395 |
| Example 5 | 13.5 | 98 | 420 |
| Example 6 | 12.0 | 43 | 347 |
| Example 7 | 12.0 | 44 | 348 |
| Example 8 | 12.0 | 44 | 347 |
| Example 9 | 12.1 | 44 | 349 |
| Example 10 | 12.5 | 60 | 370 |
| Example 11 | 12.4 | 60 | 371 |
| Example 12 | 12.0 | 46 | 352 |
| Example 13 | 12.5 | 45 | 340 |
| Example 14 | 12.7 | 48 | 360 |

TABLE 2-continued

| | | | |
|---|---|---|---|
| Example 15 | 15.0 | 80 | 520 |
| Example 16 | 17.5 | 95 | 650 |
| Example 17 | 19.0 | 110 | 750 |
| Example 18 | 3.2 | 15 | 59 |
| Example 19 | 19.5 | 125 | 765 |
| Example 20 | 14.0 | 100 | 415 |
| Example 21 | 13.5 | 70 | 380 |
| Comparative Example 1 | 22.0 | 180 | 800 |
| Comparative Example 2 | 15.0 | 150 | 510 |

[Evaluation of In-Plane Uniformity]

The resist composition prepared above was applied onto an Si substrate (manufactured by Advanced Materials Technology), which had been subjected to a hexamethyldisilazane treatment, using a spin coater "ACT-8" manufactured by Tokyo Electron Limited, while not being provided with an antireflection layer, and dried by heating at 130° C. for 60 seconds to form a resist film having a film thickness corresponding to each resist composition shown in Table 2.

The film thickness was measured concentrically at 300 points from the center of the Si substrate, using a VM-3110 manufactured by SCREEN Semiconductor Solutions Co., Ltd., and 3σ (nm) of these values was taken as an index of in-plane uniformity. The smaller the 3σ is, the better the in-plane uniformity is.

The evaluation results are shown in Table 2.

As shown in Table 2, it was confirmed that the in-plane uniformity of a film thickness is extremely excellent by the resist compositions of Examples 1 to 21 produced using the production method of the embodiment of the present invention, as compared with the resist compositions produced by Comparative Examples 1 and 2, particularly in a case of forming a resist film in the form of a thick film.

The resist composition produced in Example 1 was subjected to pattern formation by the following method.

<Pattern Formation>

The prepared resist composition was applied onto an Si substrate (manufactured by Advanced Materials Technology), which had been subjected to a hexamethyldisilazane treatment, using a spin coater "ACT-8" manufactured by Tokyo Electron Limited, while not being provided with an antireflection layer, and dried by heating at 130° C. for 60 seconds to form a resist film having a film thickness of 10 μm. This resist film was exposed under the exposure conditions of the number of apertures (NA)=0.68 and σ=0.60 at the following optimal exposure amount through the following mask, using a KrF excimer laser scanner (manufactured by ASML, PAS5500/850C wavelength: 248 nm). After the irradiation, the film was baked at 130° C. for 60 seconds, dipped using a 2.38%-by-mass aqueous tetramethylammonium hydroxide (TMAH) solution for 60 seconds, then rinsed with water for 30 seconds, and dried.

Exposure was performed through a mask having a line-and-space pattern such that a space pattern after reduced projection exposure was 3 μm and the pitch was 33 μm, and the exposure amount such that a space pattern thus formed was 3 μm and the pitch was 33 μm was taken as an optimal exposure amount (sensitivity) (mJ/cm$^2$). The space pattern width was measured using a scanning electron microscope (SEM) (9380I manufactured by Hitachi, Ltd.).

According to the procedure, a pattern wafer for evaluation, having a substrate and a pattern (resist pattern) formed on a surface of the substrate, was obtained.

1 inch corresponds to 25.4 millimeters.

According to the present invention, it is possible to provide a method for producing an actinic ray-sensitive or radiation-sensitive resin composition capable of forming an actinic ray-sensitive or radiation-sensitive resin film having extremely excellent in-plane uniformity of a film thickness in a case of forming an actinic ray-sensitive or radiation-sensitive resin film in the form of a thick film (for example, having a thickness of 1 μm or more), a pattern forming method using the method for producing an actinic ray-sensitive or radiation-sensitive resin composition, and a method for manufacturing an electronic device.

Although the present invention has been described in detail with reference to specific embodiments, it will be apparent to those skilled in the art that various changes and modifications can be made without departing from the spirit and the scope of the present invention.

EXPLANATION OF REFERENCES

10: stirring tank
12: stirring shaft
14: stirring blade
16: gas introduction port
18: gas discharge port
20: temperature sensor
22: tank
24: gas temperature control device
26: flow rate control device
100: production device

What is claimed is:

1. A method for producing an actinic ray-sensitive or radiation-sensitive resin composition having a viscosity of 10 mPa·s or more, the method comprising:

a step 1 of charging at least a resin of which polarity increases by an action of an acid, a photoacid generator, and a solvent as raw materials into a stirring tank; and a step 2 of stirring the raw materials in the stirring tank, wherein a liquid temperature in the stirring tank is controlled to be equal to or lower than a 3.0° C. higher temperature than a liquid temperature at a start of the step 2 throughout the entire step 2, and the control of the liquid temperature in the stirring tank in the step 2 is performed by passing an inert gas through the stirring tank.

2. The method for producing an actinic ray-sensitive or radiation-sensitive resin composition according to claim 1, wherein a temperature of the inert gas for passing through the stirring tank is 15° C. to 20° C.

3. The method for producing an actinic ray-sensitive or radiation-sensitive resin composition according to claim 1, wherein the stirring in the step 2 is performed by a stirring shaft having a stirring blade, and a rotation speed of the stirring shaft is 50 to 400 rpm.

4. The method for producing an actinic ray-sensitive or radiation-sensitive resin composition according to claim 2, wherein the stirring in the step 2 is performed by a stirring shaft having a stirring blade, and a rotation speed of the stirring shaft is 50 to 400 rpm.

5. The method for producing an actinic ray-sensitive or radiation-sensitive resin composition according to claim 1, wherein the liquid temperature in the stirring tank is controlled to be equal to or lower than a 2.0° C. higher temperature than a liquid temperature at a start of the step 2 throughout the entire step 2.

6. The method for producing an actinic ray-sensitive or radiation-sensitive resin composition according to claim 2, wherein the liquid temperature in the stirring tank is controlled to be equal to or lower than a 2.0° C. higher temperature than a liquid temperature at a start of the step 2 throughout the entire step 2.

7. The method for producing an actinic ray-sensitive or radiation-sensitive resin composition according to claim 3, wherein the liquid temperature in the stirring tank is controlled to be equal to or lower than a 2.0° C. higher temperature than a liquid temperature at a start of the step 2 throughout the entire step 2.

8. The method for producing an actinic ray-sensitive or radiation-sensitive resin composition according to claim 4, wherein the liquid temperature in the stirring tank is controlled to be equal to or lower than a 2.0° C. higher temperature than a liquid temperature at a start of the step 2 throughout the entire step 2.

9. The method for producing an actinic ray-sensitive or radiation-sensitive resin composition according to claim 1, wherein the viscosity of the actinic ray-sensitive or radiation-sensitive resin composition is 100 mPa·s or more.

10. The method for producing an actinic ray-sensitive or radiation-sensitive resin composition according to claim 1, wherein the stirring in the step 2 is performed by a stirring shaft having a stirring blade, and in a case where the viscosity of the actinic ray-sensitive or radiation-sensitive resin composition is denoted as X, $Y<40\times Ln(X)+65$ is satisfied (where Y represents a rotation speed of the stirring blade) in the step 2.

11. The method for producing an actinic ray-sensitive or radiation-sensitive resin composition according to claim 1, wherein the liquid temperature is controlled by adjusting a flow rate of the inert gas passing through the stirring tank.

12. The method for producing an actinic ray-sensitive or radiation-sensitive resin composition according to claim 1, wherein a concentration of solid contents of the actinic ray-sensitive or radiation-sensitive resin composition is 20% by mass or more.

13. The method for producing an actinic ray-sensitive or radiation-sensitive resin composition according to claim 1, wherein the resin of which polarity increases by an action of an acid includes a repeating unit having an acid-decomposable group and a repeating unit represented by General Formula (1), and the resin of which polarity increases by an action of an acid has an aromatic ring group, (1)

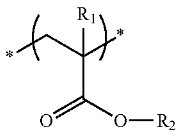

in General Formula (1), $R_1$ represents a hydrogen atom, a halogen atom, or an alkyl group, and $R_2$ represents an alkyl group having 2 or more carbon atoms.

14. A pattern forming method comprising:

a step of forming a resist film having a film thickness of 3 μm to 20 μm on a substrate using the actinic ray-sensitive or radiation-sensitive resin composition produced by the method according to claim 1;

a step of exposing the resist film; and a step of developing the exposed resist film using a developer to form a pattern.

15. A method for manufacturing an electronic device, comprising the pattern forming method according to claim 14.

* * * * *